US008174874B2

(12) United States Patent
Inaba

(10) Patent No.: US 8,174,874 B2
(45) Date of Patent: May 8, 2012

(54) SEMICONDUCTOR MEMORY DEVICE

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/883,019

(22) Filed: Sep. 15, 2010

(65) Prior Publication Data
US 2011/0069534 A1 Mar. 24, 2011

(30) Foreign Application Priority Data

Sep. 18, 2009 (JP) ................................. 2009-218105

(51) Int. Cl.
*G11C 11/00* (2006.01)
(52) U.S. Cl. ......... 365/158; 365/148; 365/163; 977/935
(58) Field of Classification Search .................. 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 5,695,864 A | 12/1997 | Slonczewski | |
| 7,457,150 B2 | 11/2008 | Tsuchida et al. | |
| 7,505,307 B2 | 3/2009 | Ueda | |
| 7,545,672 B2 | 6/2009 | Ueda et al. | |
| 2007/0206406 A1* | 9/2007 | Ueda et al. ................ | 365/158 |
| 2007/0279963 A1* | 12/2007 | Tsuchida et al. ............ | 365/148 |
| 2009/0014703 A1 | 1/2009 | Inaba et al. | |
| 2009/0250735 A1* | 10/2009 | Asao ......................... | 257/295 |
| 2010/0103718 A1* | 4/2010 | Asao et al. ................. | 365/148 |

FOREIGN PATENT DOCUMENTS

| | | |
|---|---|---|
| JP | 2007-235047 | 9/2007 |
| JP | 2007-317795 | 12/2007 |
| JP | 2008-047220 | 2/2008 |
| JP | 2008-123641 | 5/2008 |

OTHER PUBLICATIONS

J. Chen et al., "Electron Mobility in Multiple Silicon Nanowires GAA nMOSFETs on (110) and (100) SOI at Room and Low Temperature", 2008 IEDM Technical Digest, pp. 757-760, Dec. 2008. C. Dupré et al., "15nm-diameter 3D Stacked Nanowires with Independent Gates Operation: φFET", 2008 IEDM Technical Digest, pp. 749-752, Dec. 2008.
T. Ernst et al., "Novel Si-based nanowire devices: Will they serve ultimate MOSFETs scaling or ultimate hybrid integration?", 2008 IEDM Technical Digest, pp. 745-748, Dec. 2008.
M. Guillorn et al., "FinFET Performance Advantage at 22nm: An AC perspective," 2008 Symposium on VLSI Technology Digest of Technical Papers, pp. 12-13, Jun. 2008.
H. Zhao et al., "Sub-Femto-Farad Capacitance-Voltage Characteristics of Single Channel Gate-All-Around Nano Wire Transistors for Electrical Characterization of Carrier Transport", 2008 IEDM Technical Digest, pp. 769-772, Dec. 2008.
Japanese Office Action dated Dec. 6, 2011 for Japanese Application No. 2009-218105 filed Sep. 18, 2009.

\* cited by examiner

*Primary Examiner* — Richard Elms
*Assistant Examiner* — Harry W Byrne
(74) *Attorney, Agent, or Firm* — Knobbe, Martens, Olson & Bear, LLP

(57) ABSTRACT

According to one embodiment, a semiconductor memory device includes bit line pairs extending in a column direction, each of the bit line pairs includes a first bit line and a second bit line, and memory cell groups connected to the bit line pairs, respectively, and each includes memory cells. Each of the memory cells comprises a first transistor, a second transistor and a resistive memory element. One end of the resistive memory element is connected to the first bit line. A drain region of the first transistor and a drain region of the second transistor are connected to each other and connected to the other end of the resistive memory element. A source region of the first transistor and a source region of the second transistor are connected to the second bit line.

10 Claims, 38 Drawing Sheets

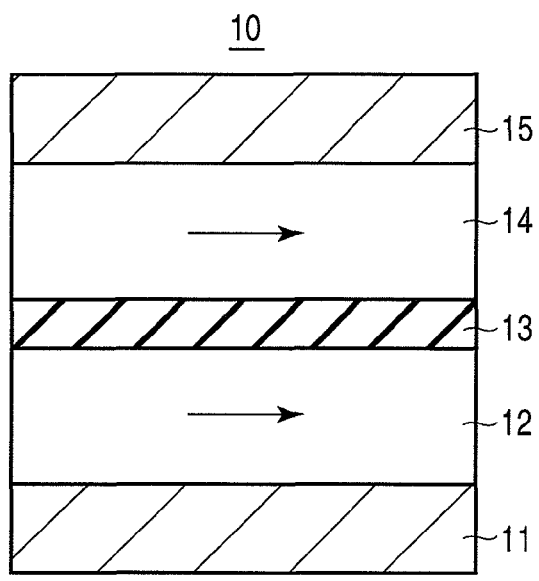
Parallel state (low resistance)
F I G. 3 A
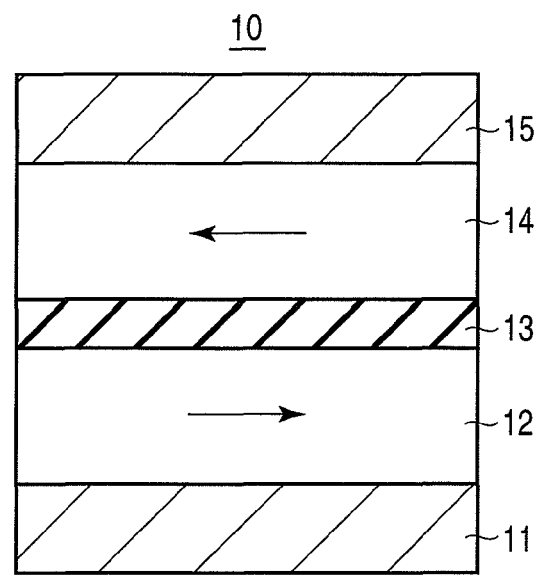
Antiparallel state (high resistance)
F I G. 3 B

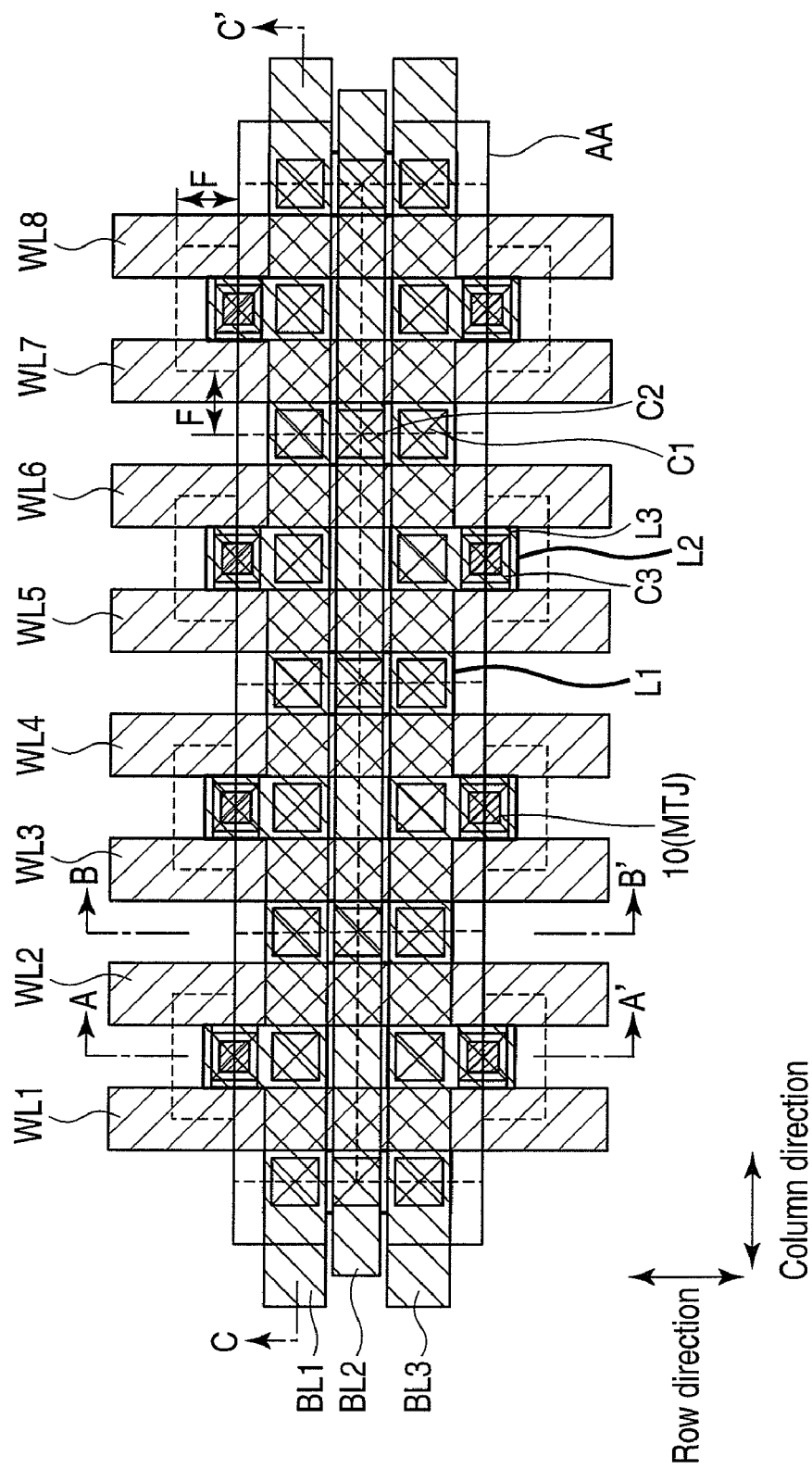
F I G. 4

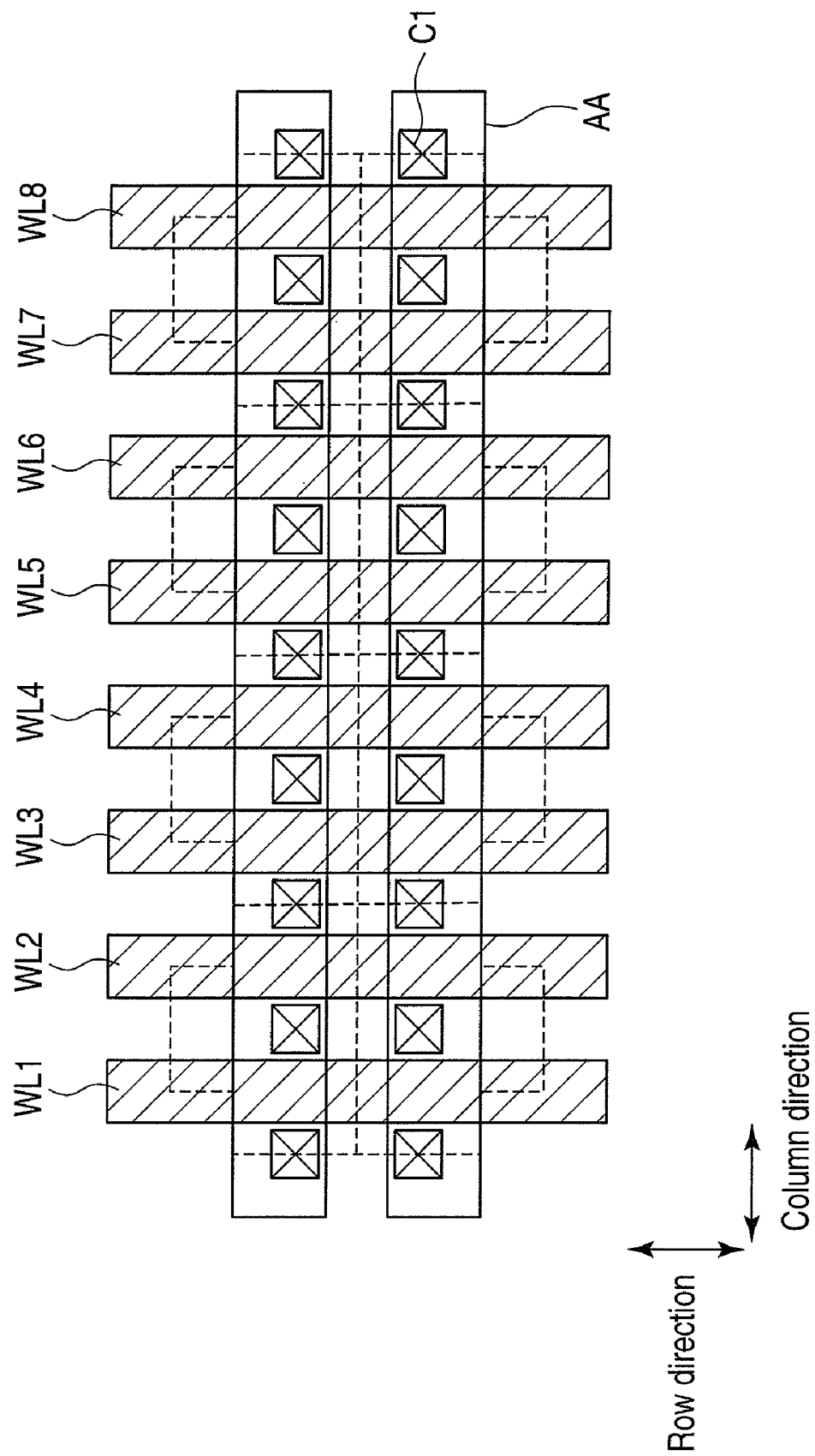
F I G. 8

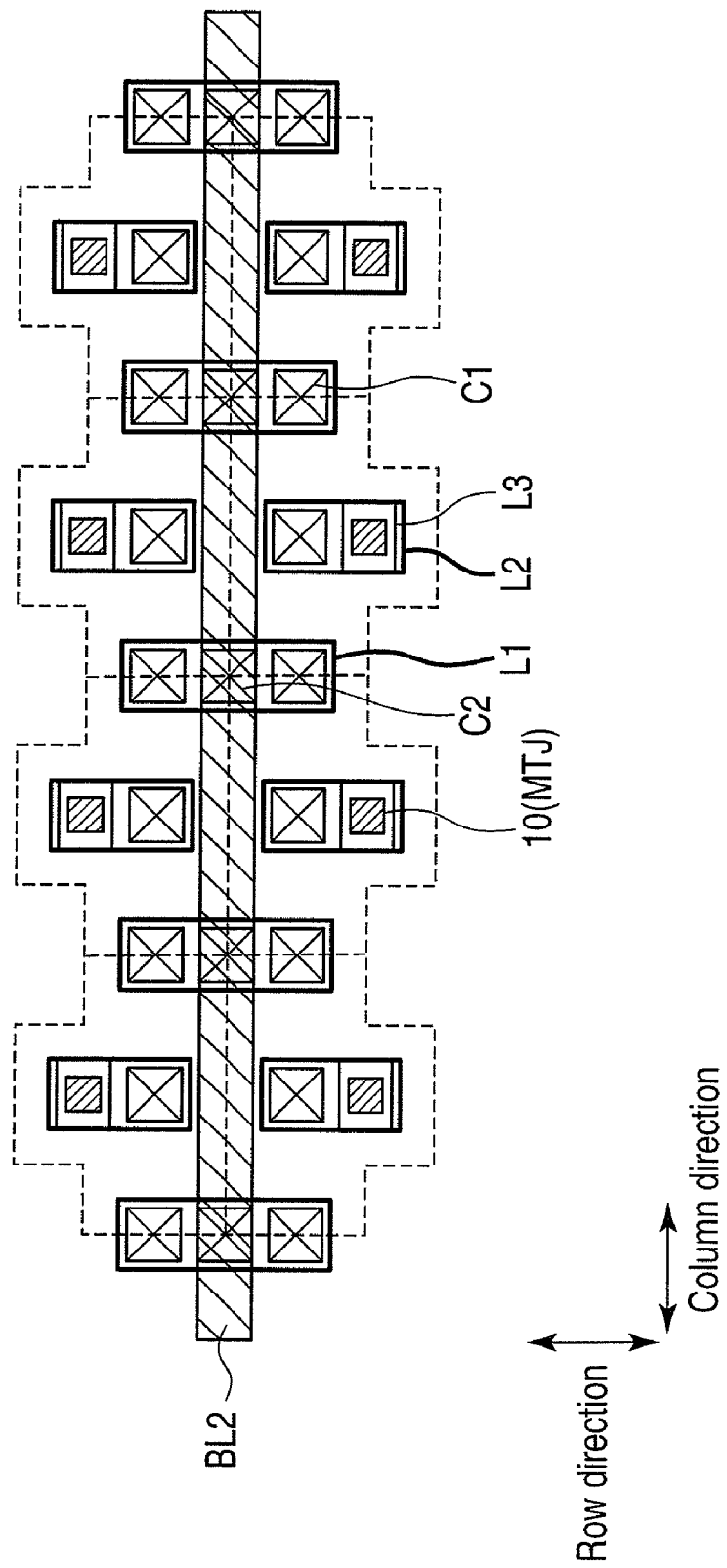
F I G. 9

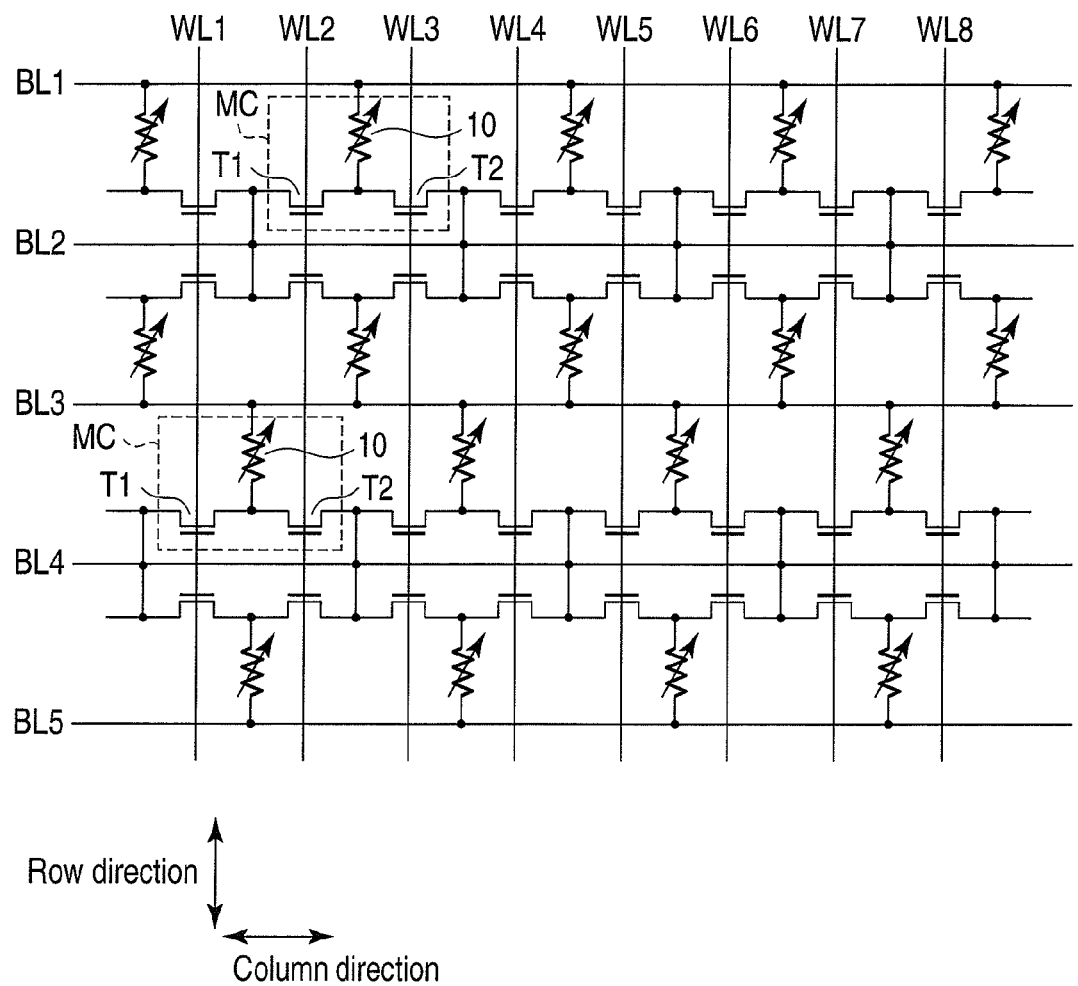
F I G. 12

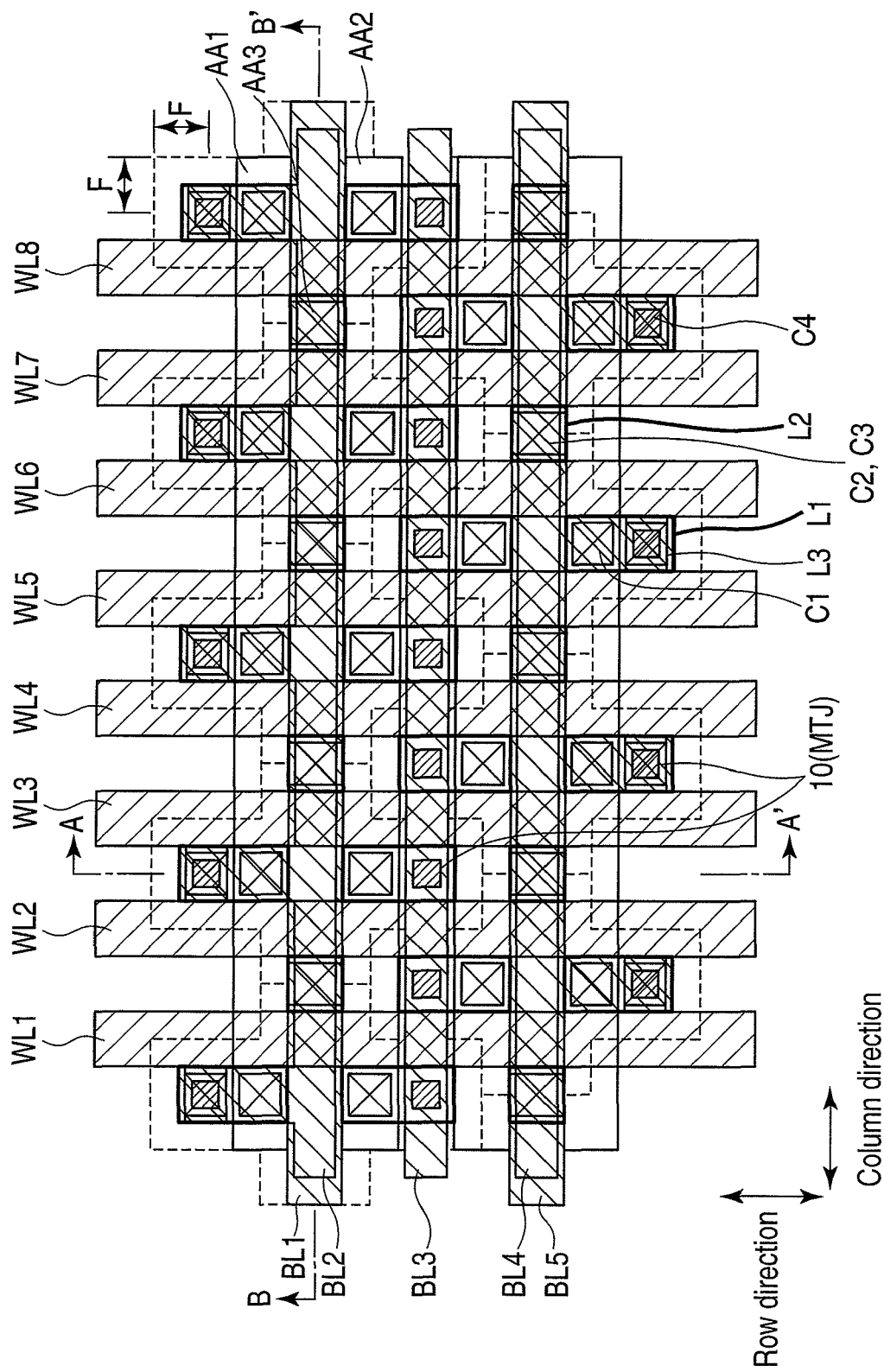
F I G. 13

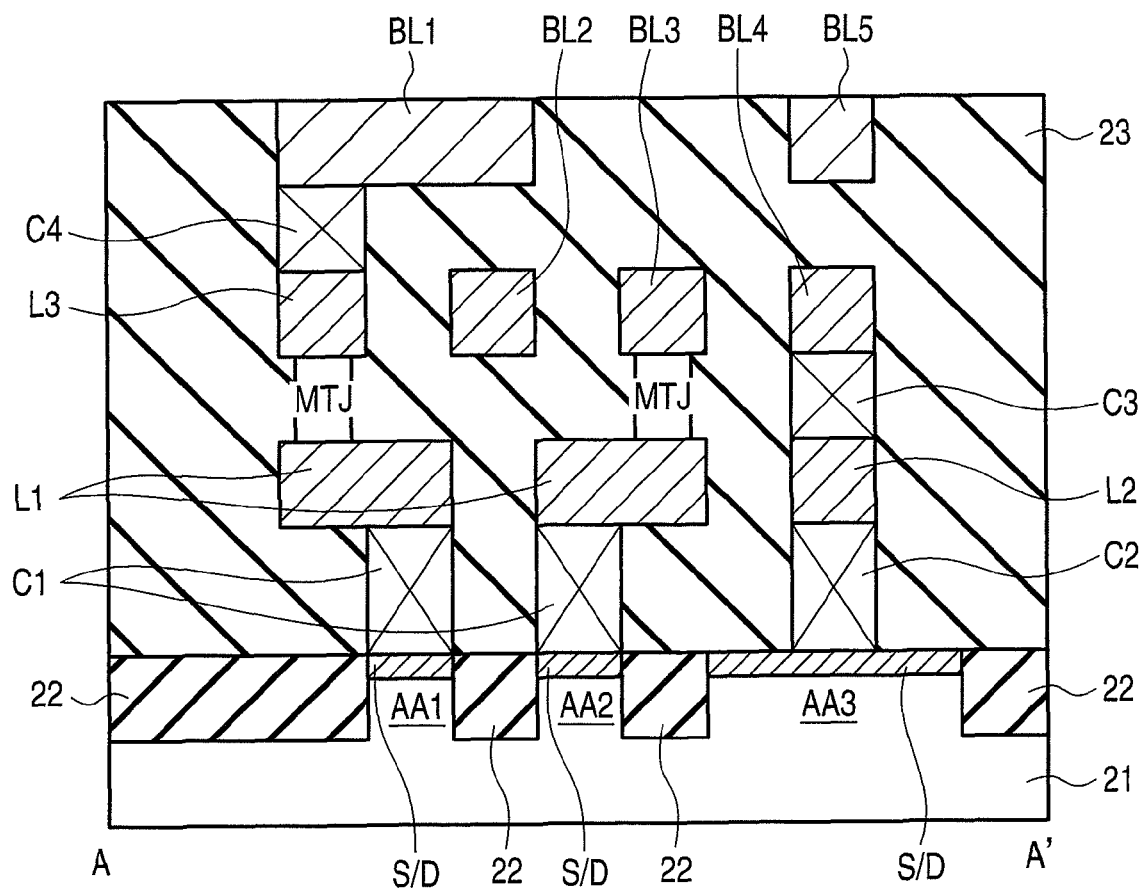
F I G. 14

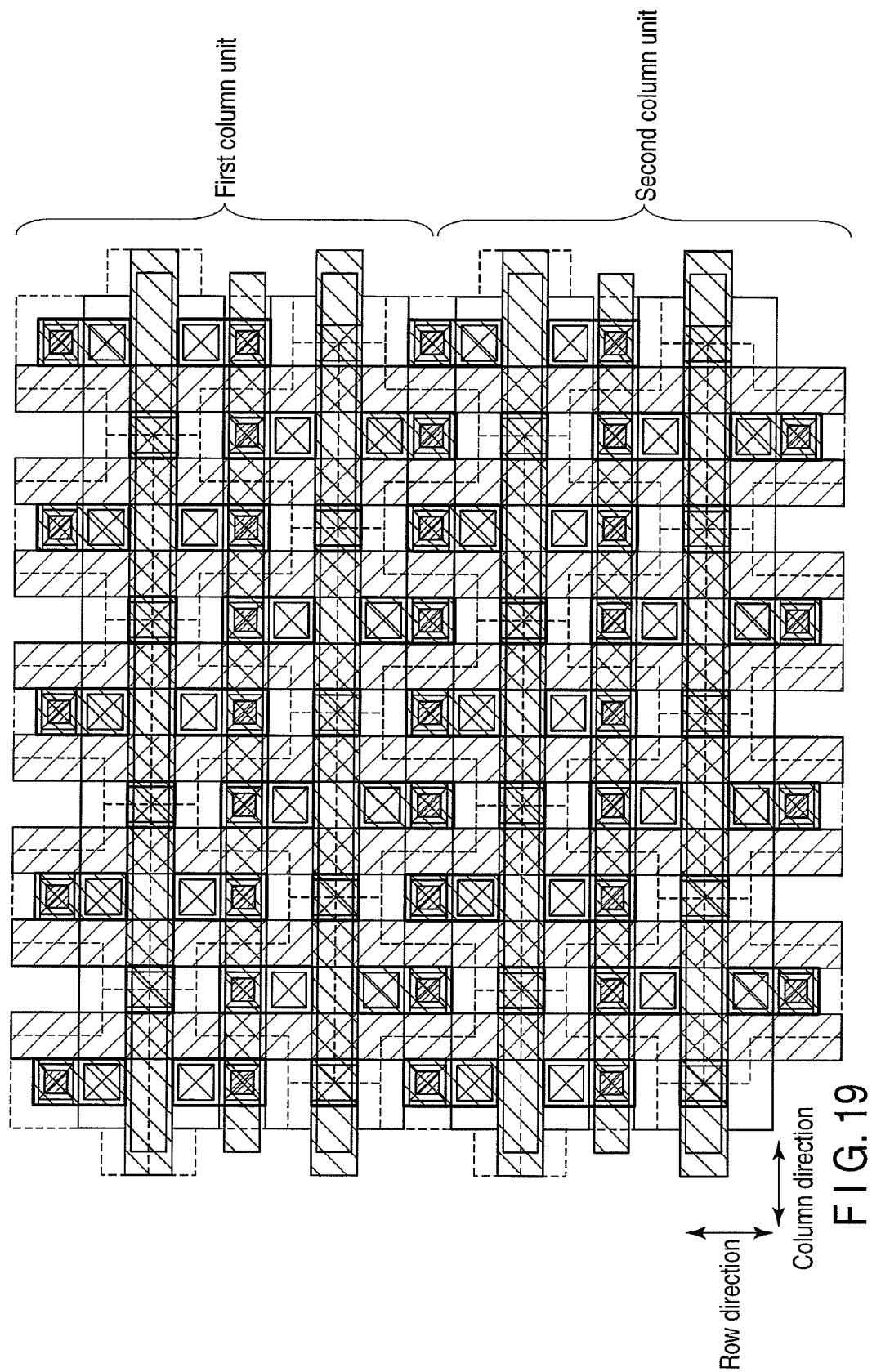
F I G. 19

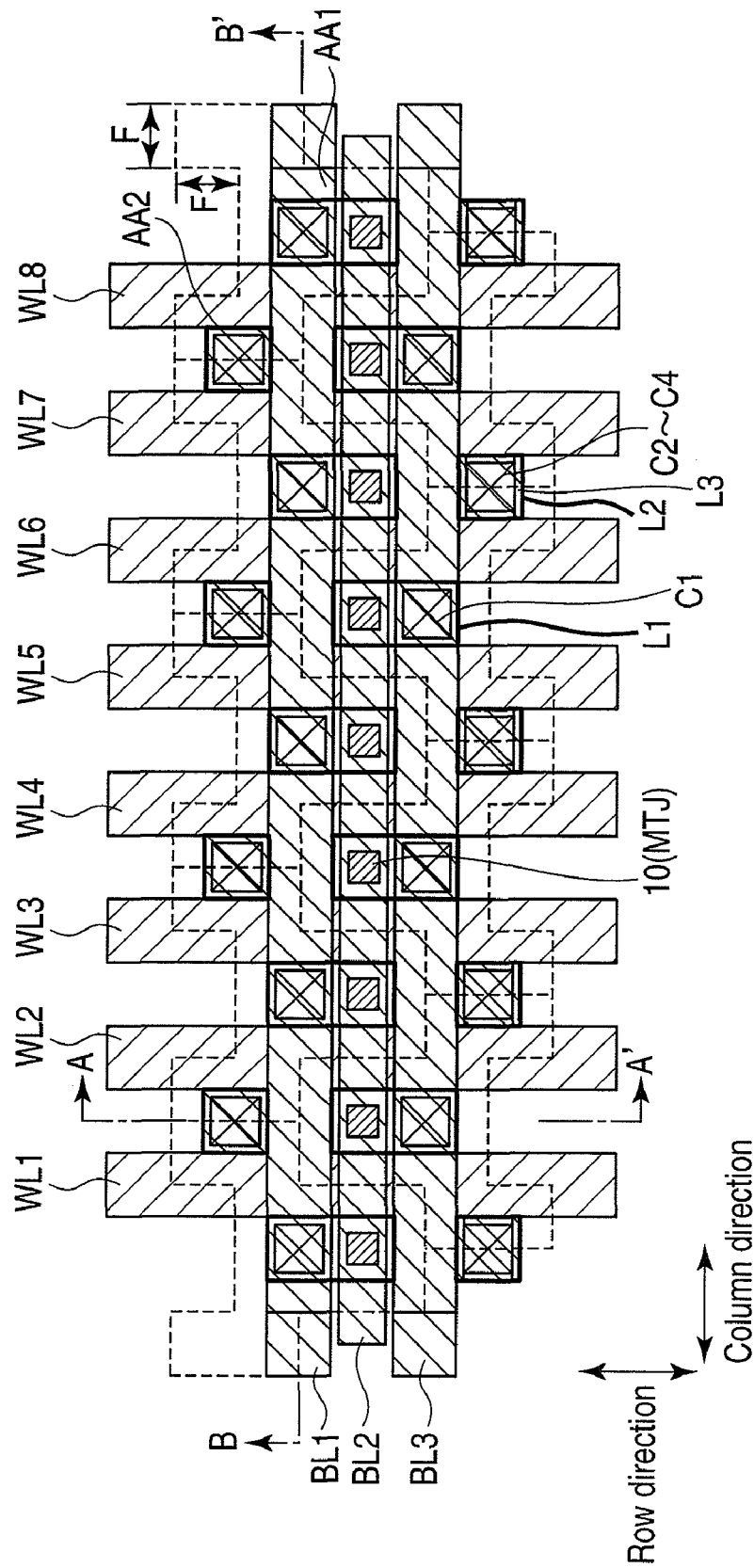
F I G. 21

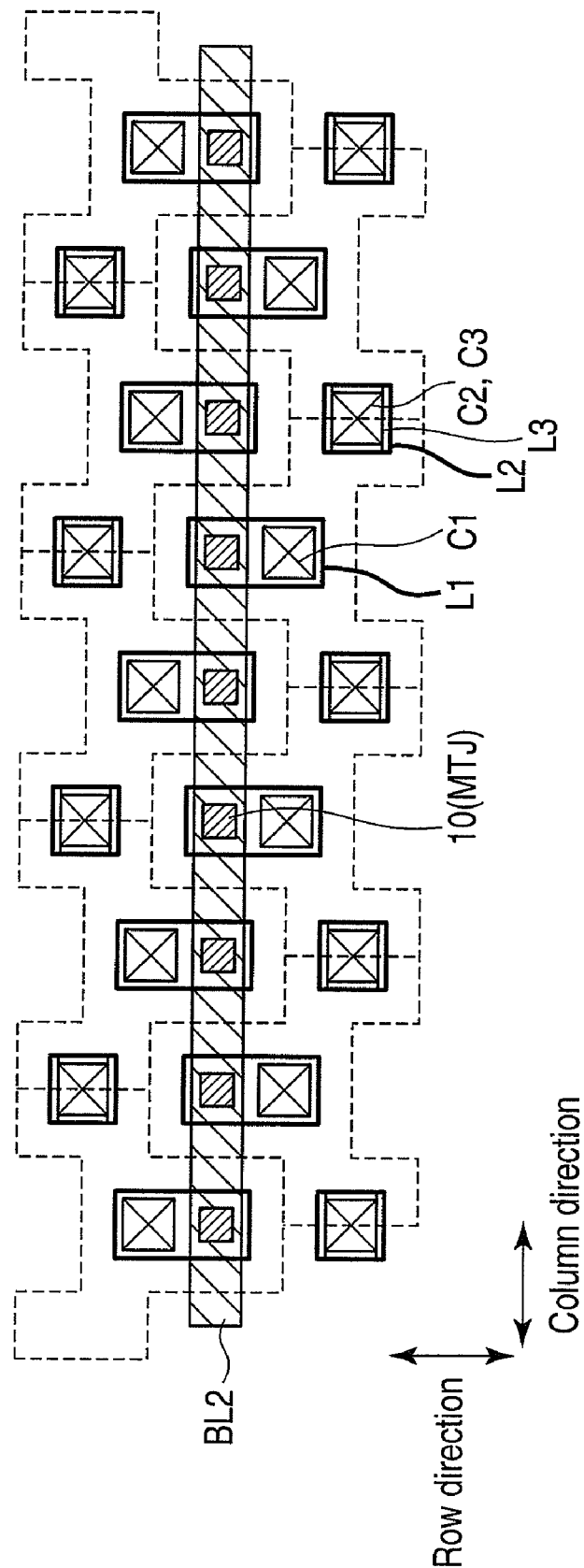
F I G. 25

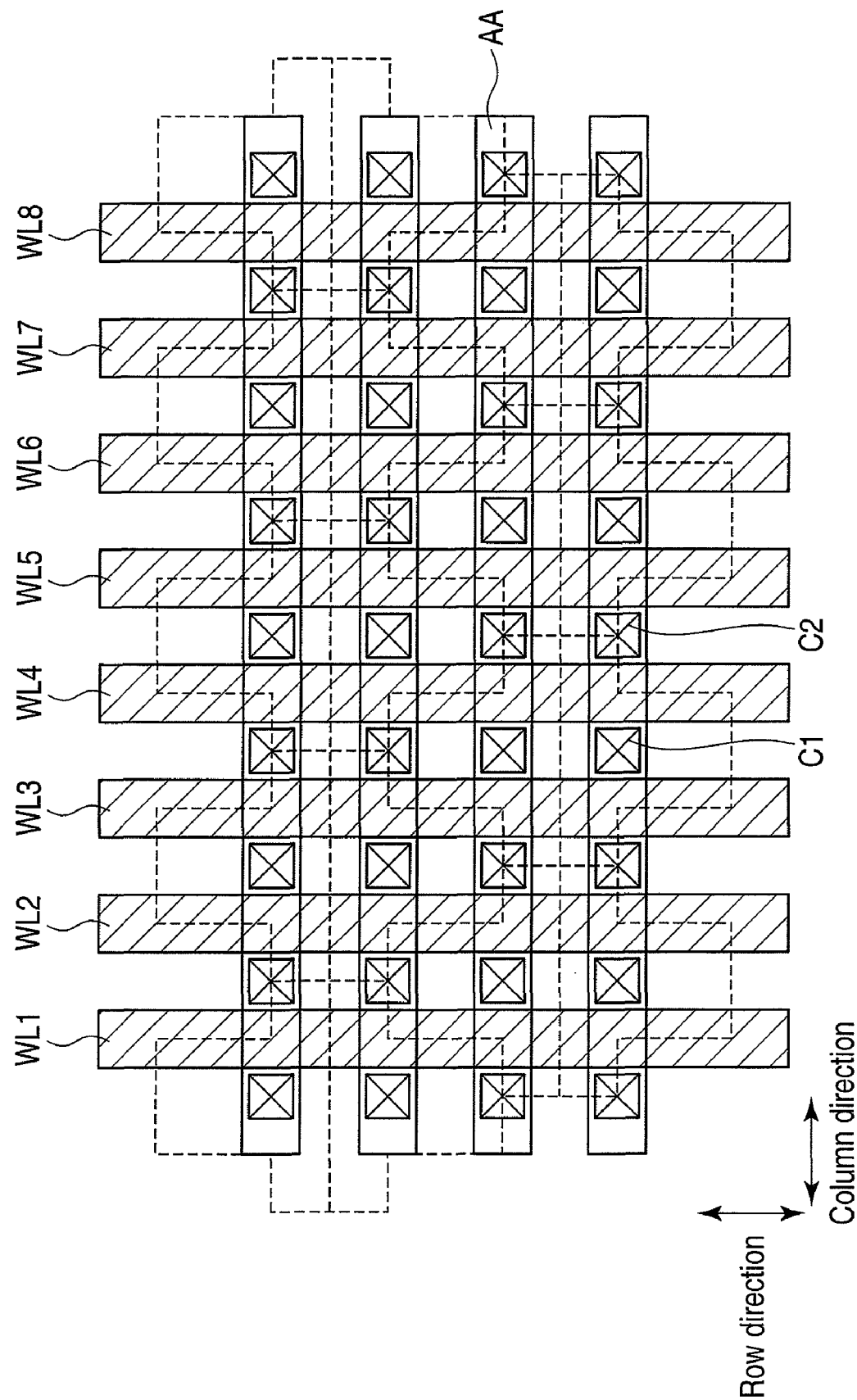
F I G. 31

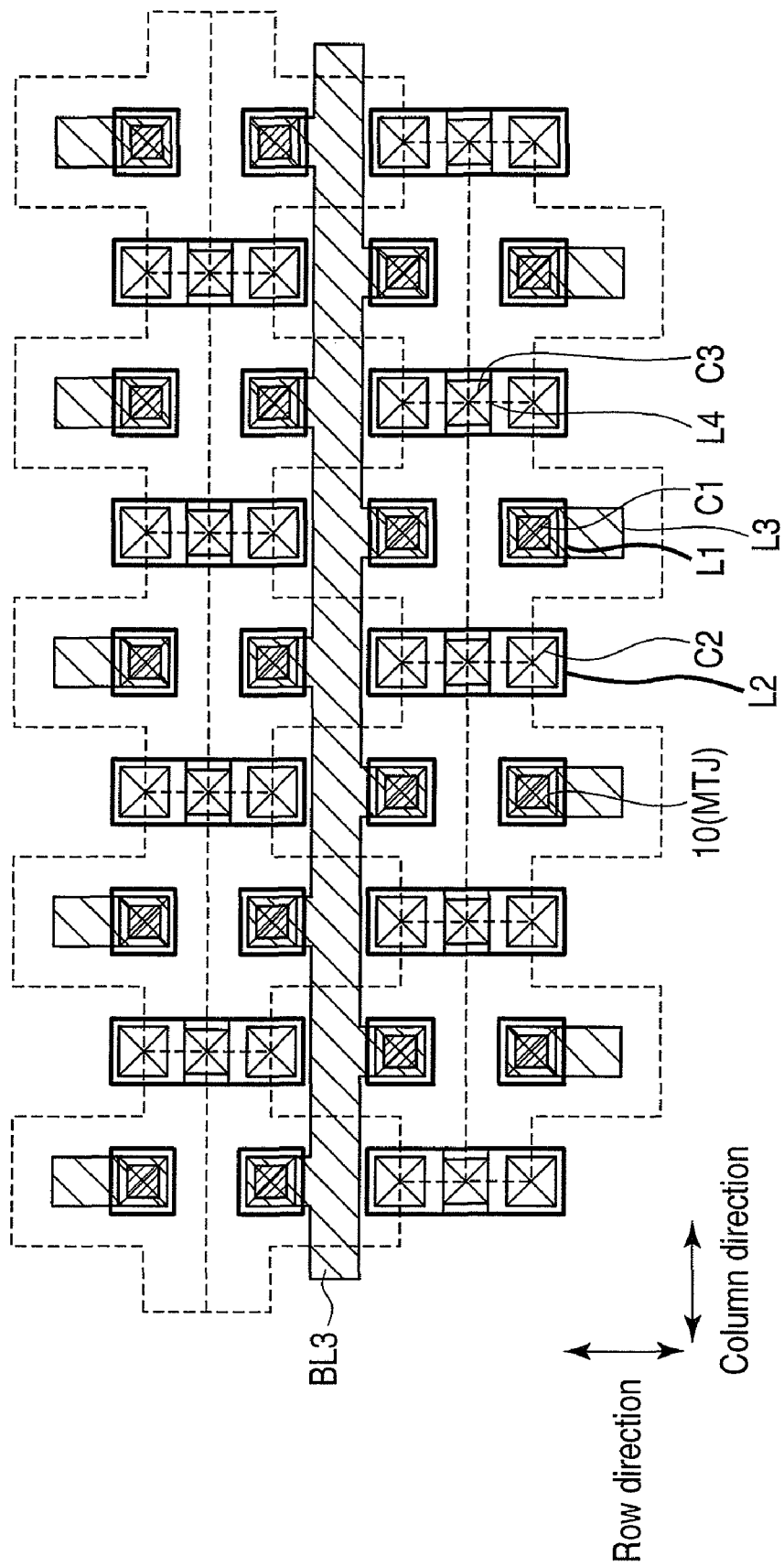
F I G. 32

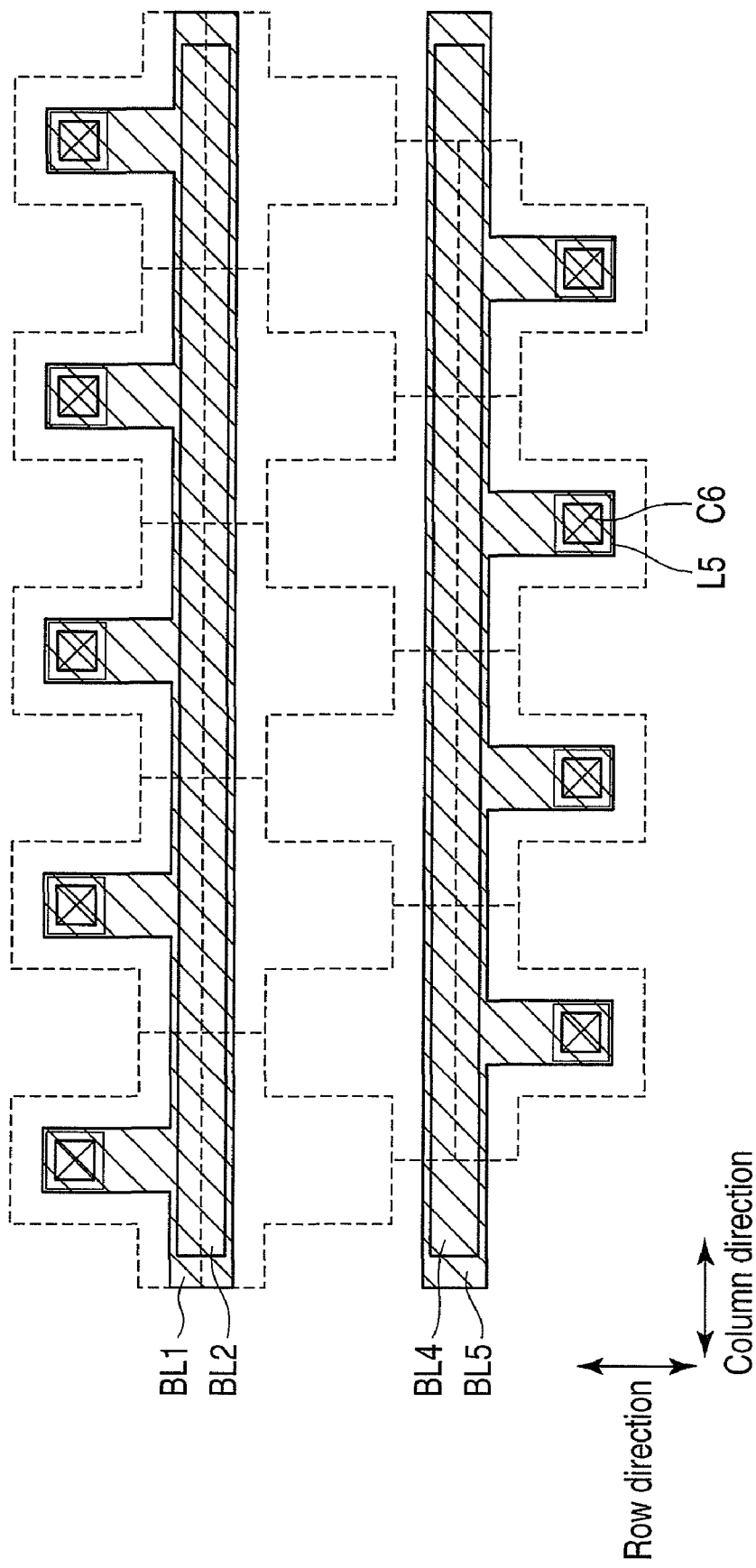
F I G. 34

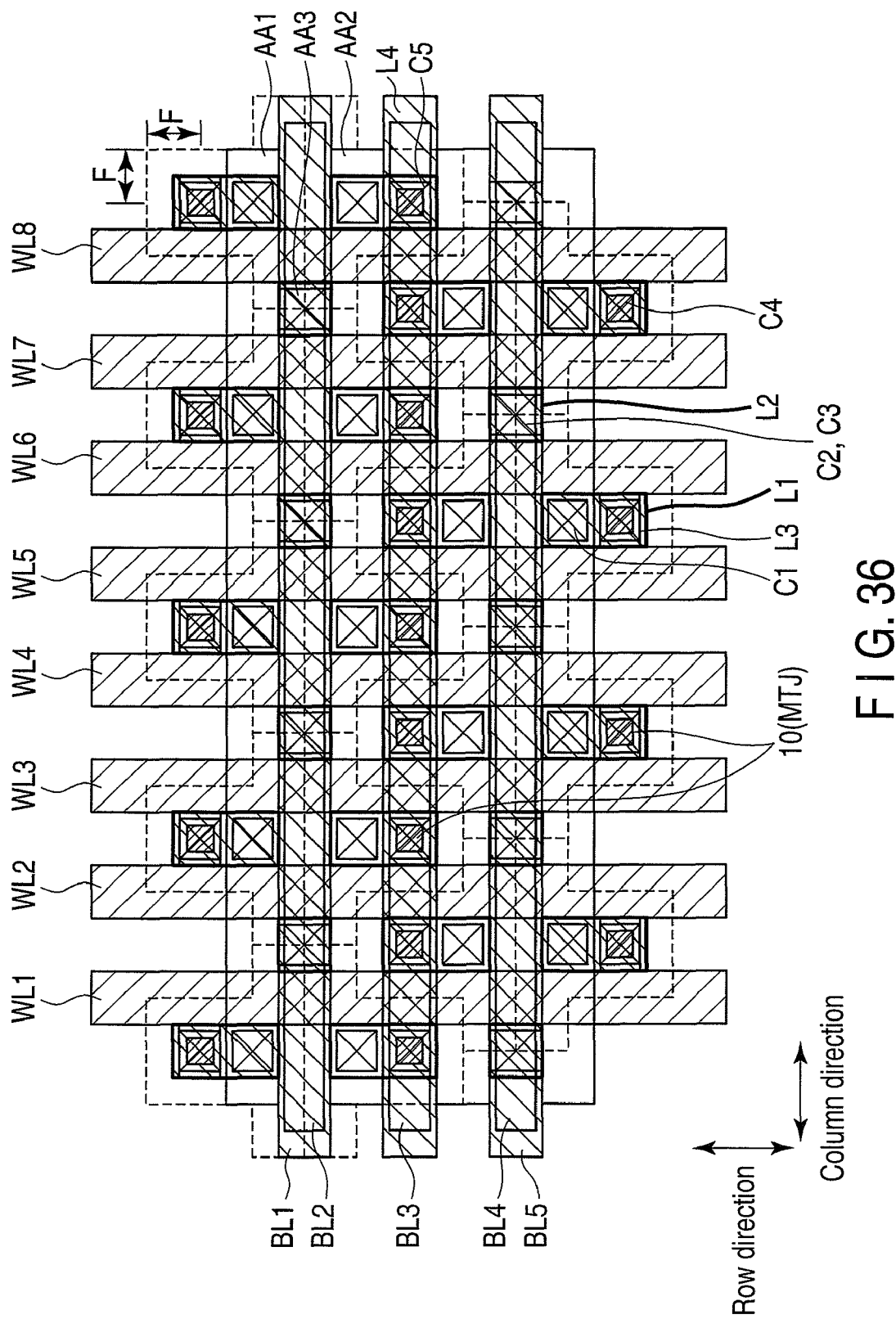
F I G. 36

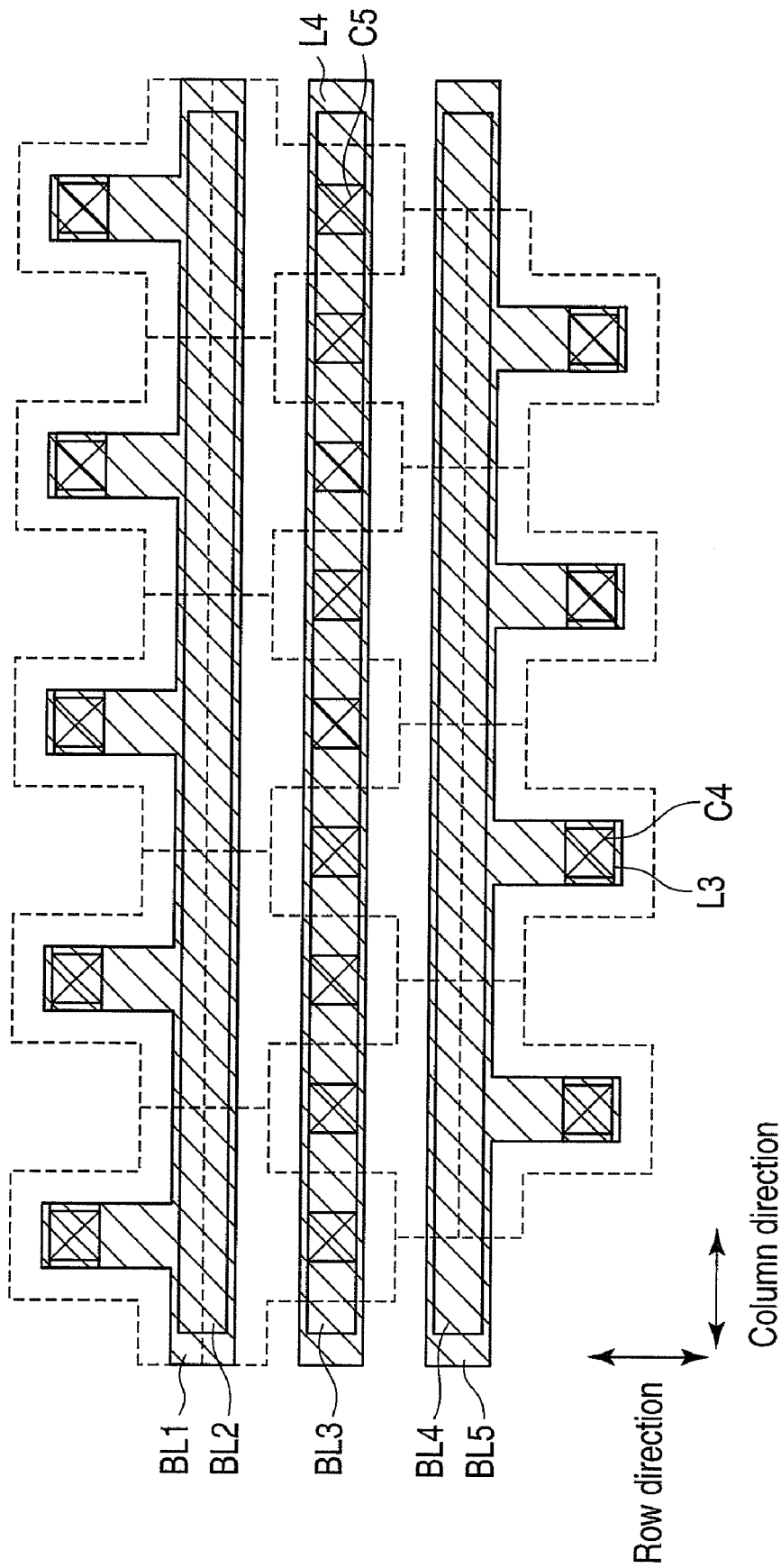
F I G. 37

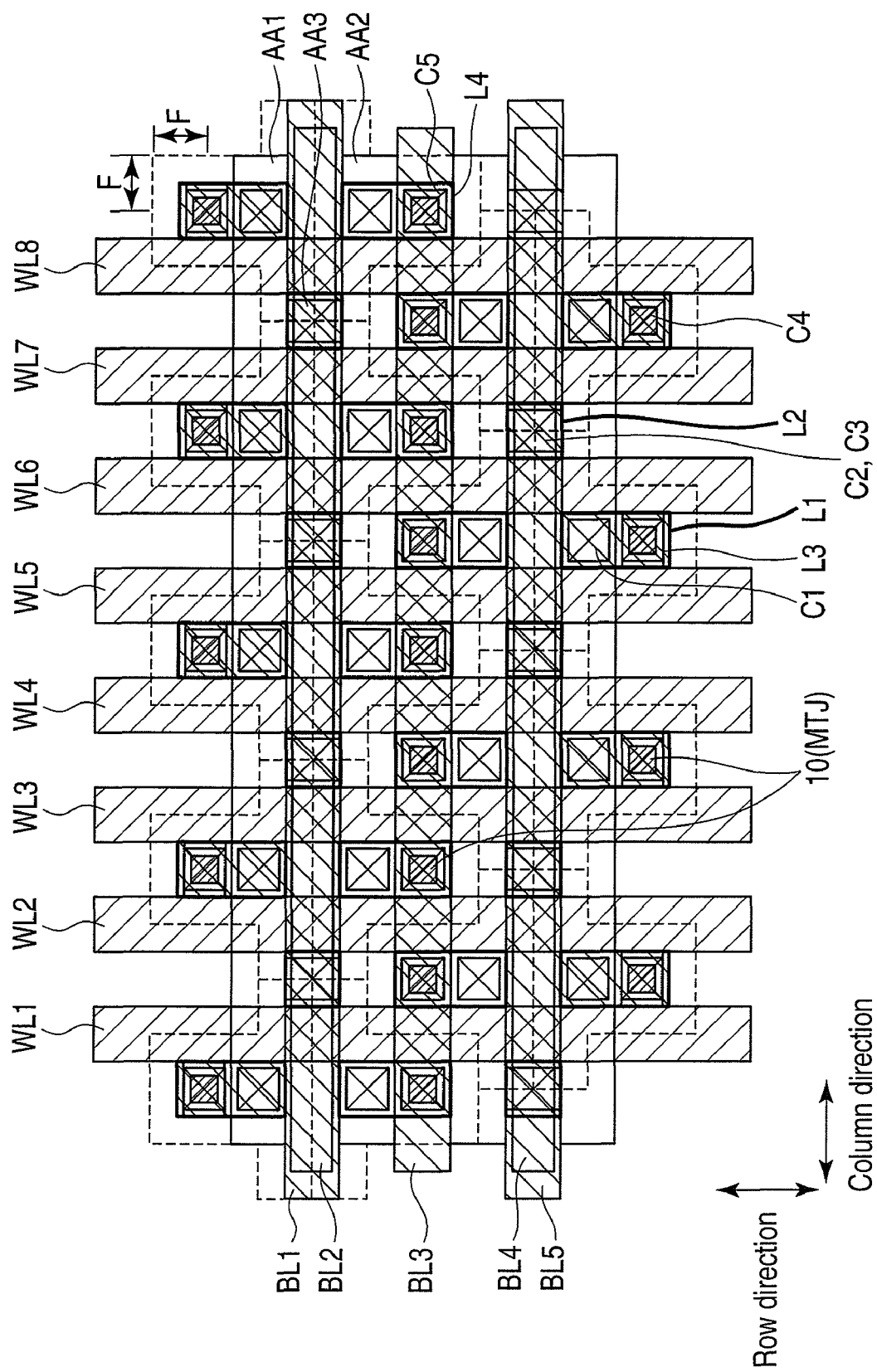
F I G. 39

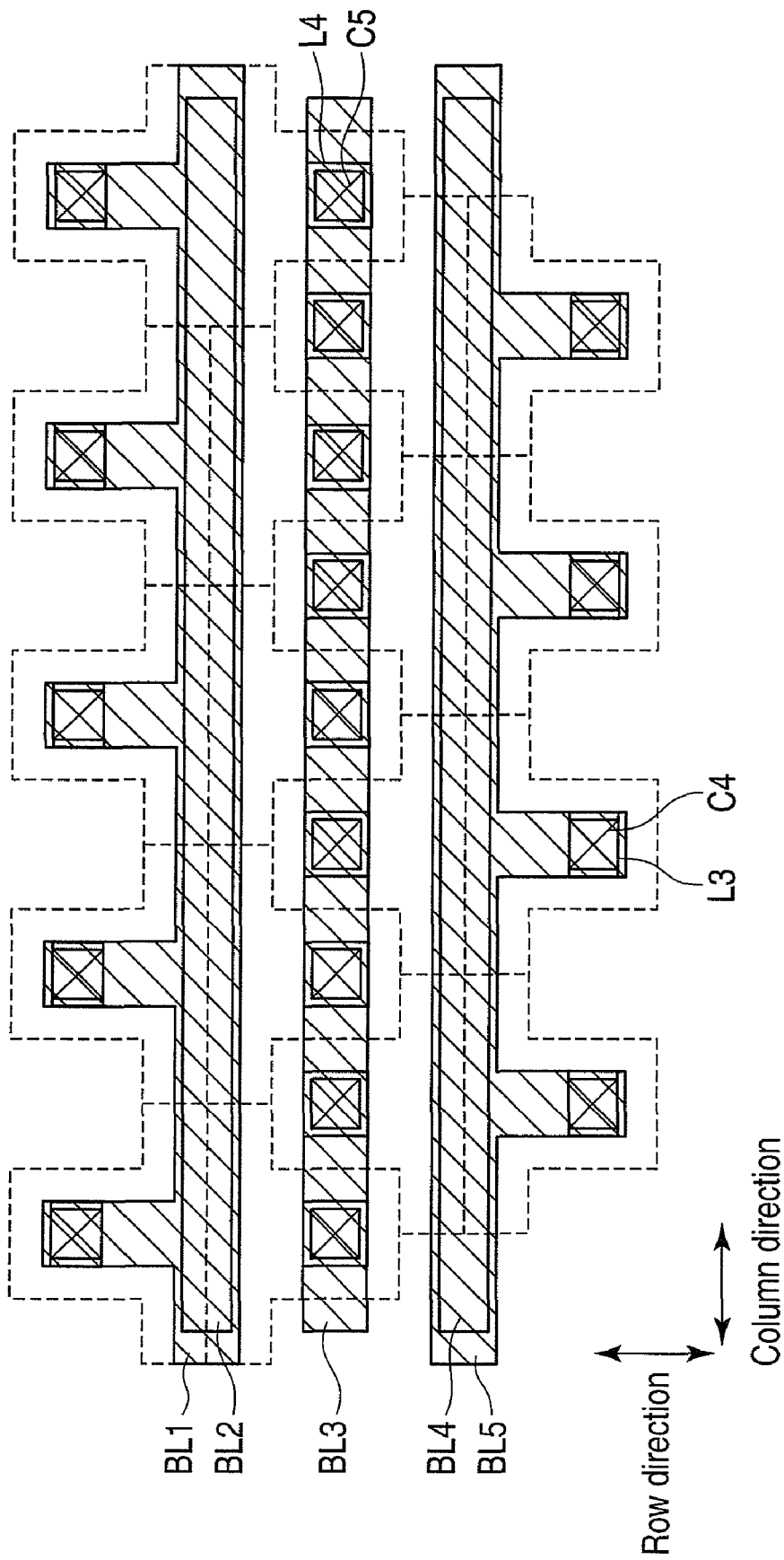
F I G. 40

SEMICONDUCTOR MEMORY DEVICE

CROSS-REFERENCE TO RELATED APPLICATIONS

This application is based upon and claims the benefit of priority from Japanese Patent Application No. 2009-218105, filed Sep. 18, 2009; the entire contents of which are incorporated herein by reference.

FIELD

Embodiments described herein relate generally to a semiconductor memory device.

BACKGROUND

In recent years, semiconductor memories using resistive elements as memory elements, such as magnetoresistive random access memory (MRAM), phase-change random access memory (PCRAM), and resistive random access memory (ReRAM), have attracted much attention and have been extensively developed. An ReRAM is a semiconductor memory which stores data by using change in resistance of a resistive memory element caused by applying a pulse voltage to the resistive memory element. At present, however, the ReRAM is still at a stage in which many models and materials are proposed for the storage mechanism thereof, and has been researched and developed by numerous manufacturers. A PCRAM is a semiconductor memory which stores data by using change in resistance of a resistive memory element caused by phase change of the crystalline structure of the resistive memory element as a result of passing a write current through the resistive memory element.

An MRAM is a semiconductor memory which stores data by using the magnetoresistive effect, in which resistance changes in accordance with the relative magnetization direction between a recording layer and a fixed layer, by using, as a memory element, a magnetoresistive element having a magnetic tunnel junction (MTJ) structure in which an insulating film is held between two ferromagnetic layers, the magnetization direction of one ferromagnetic layer (fixed layer) is fixed, and the magnetization direction of the other ferromagnetic layer (recording layer) is made reversible. In particular, the MRAM has the merit of nonvolatility, fast operability, high integration, and high reliability, and thus is expected as a memory device which can replace the SRAM, pseudo-SRAM (PSRAM), and DRAM.

In the prior art, a write method using a current induction magnetic field is commonly adopted as the write method of an MRAM. This is a write method in which the magnetization direction of the recording layer is reversed by a magnetic field induced by a current flowing through a write line. An MRAM adopting the current induction magnetic field method has problems such as a large write current due to being an indirect write method, and an increase in write current due to the increase in reversal magnetic field necessary for magnetization reversal of the recording layer caused by scaling down of the magnetoresistive element. As means for solving the problems, a spin-transfer MRAM using magnetization reversal by a polarization spin current has attracted attention and has been developed. In a spin-transfer MRAM, a current (reversal threshold current) necessary for spin-transfer magnetization reversal is determined by a current density flowing through the magnetoresistive element, and thus the reversal threshold current reduces as the area of the magnetoresistive element is reduced. Specifically, since the reversal threshold value is subjected to scaling, the spin-transfer MRAM is expected as technique which can realize a semiconductor memory of large capacity.

In a spin-transfer MRAM, a write is performed by causing a write current exceeding the reversal threshold value to flow through the magnetoresistive element, and data polarity thereof is determined by the direction of the write current flowing through the magnetoresistive element. For example, in common memory cells of 1Tr+1MTJ (1T1R) type, one end of an MTJ element is connected to a bit line, the other end of the MTJ element is connected to one source/drain electrode of a transistor (Tr), and the other source/drain electrode of the transistor is connected to a bit line different from the bit line to which the MTJ element is connected, and a gate electrode of the transistor is connected to a word line. In such a cell structure, the transistor is required to have a current driving capacity exceeding the reversal threshold current of the MTJ element. However, it is technically difficult to reduce the reversal threshold current of the MTJ element, and there are cases where the current driving capacity of the transistor is not sufficient for a write to the MTJ element.

In addition, it is desirable that a gate width (W) of a transistor forming a memory cell is formed with a minimum feature size (F) from the viewpoint of reducing the chip size. However, since the current driving capacity of a transistor depends on the gate width, and there are cases where it is inevitable to increase the gate width of the transistor. In such cases, there is the problem that the layout area of a memory cell increases, and the chip size increases, too. In addition, although it is desirable that the resistance of the MTJ element is small in view of reading and writing, the resistance of the whole memory cell, that is, the rate of the channel resistance of the transistor occupying the sum of the channel resistance of the transistor and the resistance of the MTJ element increases when the resistance of the MTJ element is reduced. This causes the problems that the influence of fluctuations in the channel resistance of the transistor during a read is increased, and that a read signal magnitude from the memory cell is reduced.

As means for solving the problems, a 2T1R cell structure obtained by adding a transistor to the conventional 1T1R structure has been proposed (for example, Japanese Patent No. 4157571). A 2T1R cell has a structure in which the transistor of a conventional 1T1R cell is replaced by two transistors connected in parallel. Adopting this structure doubles the current driving capacity, and reduces the channel resistance by half. However, since one transistor is added to the conventional structure, it has the problem that the layout area of a memory cell is increased.

In addition, as means for reducing the layout area of a memory cell, a method of sharing a bit line between adjacent columns, that is, a bit line pair, has been proposed (for example, Jpn. Pat. Appln. KOKAI Pub. No. 2007-235047). According to this method, the layout area of a memory cell is reduced by sharing a bit line between adjacent columns, and sharing a bit line contact (a contact connecting a source/drain diffusion layer of the transistor with a bit line) of the transistor between adjacent rows (adjacent cells in the same column).

Even by these ideas, however, the layout area of the layout area of a 2T1R memory cell can only be reduced to $10F^2$ (in the case of sharing a bit line between 4 columns), or $12F^2$ (in the case of sharing a bit line between 2 columns), and they are larger than $8F^2$ which is a common layout area of a conventional 1T1R cell.

BRIEF DESCRIPTION OF THE DRAWINGS

FIGS. 3A and 3B are diagrams for explaining a low-resistance state and a high-resistance state of the MTJ element 10;

FIG. 4 is a layout diagram of the resistance-change memory according to the first embodiment;

FIG. 8 is a layout diagram illustrating layers being a part of the structure of FIG. 4 and extracted from FIG. 4;

FIG. 9 is a layout diagram illustrating layers being a part of the structure of FIG. 4 and extracted from FIG. 4;

FIG. 12 is a circuit diagram of a resistance-change memory according to a second embodiment;

FIG. 13 is a layout diagram of the resistance-change memory according to the second embodiment;

FIG. 14 is a cross-sectional view of the resistance-change memory taken along line A-A' in FIG. 13;

FIG. 19 is a layout diagram illustrating two column units arranged in a row direction;

FIG. 21 is a layout diagram of the resistance-change memory according to the third embodiment;

FIG. 25 is a layout diagram of layers being a part of the structure of FIG. 21 and extracted from FIG. 21;

FIG. 31 is a layout diagram of layers being a part of the structure of FIG. 28 and extracted from FIG. 28;

FIG. 32 is a layout diagram of layers being a part of the structure of FIG. 28 and extracted from FIG. 28;

FIG. 34 is a layout diagram of layers being a part of the structure of FIG. 28 and extracted from FIG. 28;

FIG. 36 is a layout diagram of a resistance-change memory according to a fifth embodiment;

FIG. 37 is a layout diagram of layers being a part of the structure of FIG. 36 and extracted from FIG. 36;

FIG. 39 is a layout diagram of a resistance-change memory according to a sixth embodiment;

FIG. 40 is a layout diagram of layers being a part of the structure of FIG. 39 and extracted from FIG. 39.

DETAILED DESCRIPTION

Figure 1:
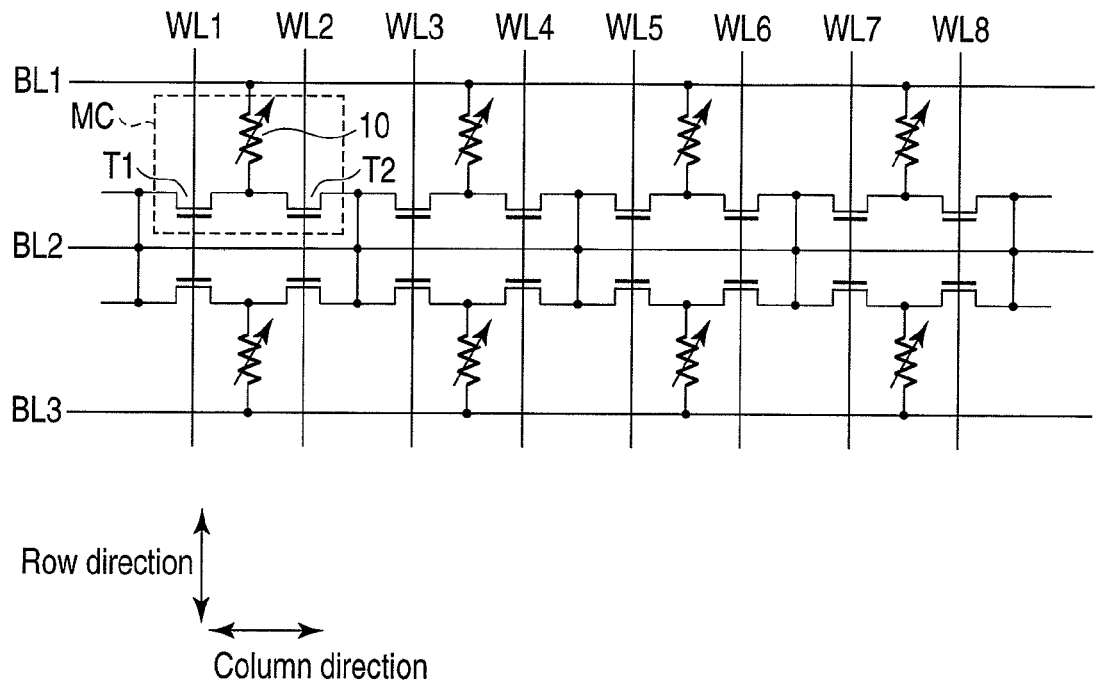
FIG. 1 is a circuit diagram of a resistance-change memory according to a first embodiment.

In general, according to one embodiment, there is provided a semiconductor memory device comprising:

bit line pairs extending in a column direction, each of the bit line pairs comprising a first bit line and a second bit line; and memory cell groups connected to the bit line pairs, respectively, and each comprising memory cells, wherein each of the memory cells comprises a first transistor, a second transistor and a resistive memory element, a gate electrode of the first transistor is connected to a first word line extending in a row direction, a gate electrode of the second transistor is connected to a second word line extending in the row direction, one end of the resistive memory element is connected to the first bit line, a drain region of the first transistor and a drain region of the second transistor are connected to each other and connected to the other end of the resistive memory element, a source region of the first transistor and a source region of the second transistor are connected to the second bit line, a second transistor of a first memory cell shares a source region with a first transistor of a second memory cell which is adjacent to the first memory cell in the column direction, two bit line pairs which are adjacent in the row direction comprise a first column unit by connecting first bit lines thereof to each other, or connecting second bit lines thereof to each other, a second bit line or a first bit line located at a center of the first column unit is formed of a first interconnect layer, a first bit line or a second bit line located at least one end portion of the first column unit is formed of a second interconnect layer located above the first interconnect layer, the second interconnect layer is connected to a diffusion region of the first transistor or a diffusion region of the second transistor through a first contact or the resistive memory element, and a first bit line or a second bit line located at least one end portion is located closer to a center of the first column unit than a connecting part between the bit line and a lower layer.

The embodiments will be described hereinafter with reference to the accompanying drawings. In the description which follows, the same or functionally equivalent elements are denoted by the same reference numerals, to thereby simplify the description.

(First Embodiment)

A first embodiment shows an example in which two columns share one bit line BL to form a basic structure (column unit), when a plurality of memory cells MC arranged in line in a column direction form one column.

FIG. 1 is a circuit diagram of a resistance-change memory (semiconductor memory device) according to the first embodiment. A memory cell array section is provided with bit lines BL1 to BL3, each of which extends in a column direction, and word lines WL1 to WL8, each of which extends in a row direction which is perpendicular to the column direction. One memory cell MC is disposed in an area in which two adjacent bit lines BL and two adjacent word lines WL cross. A memory cell array is formed, in which a plurality of memory cells MC are arranged in rows and columns. Each memory cell MC is formed of two select transistors T1 and T2 and one resistive memory element 10. Specifically, each memory cell MC is a 2T1R memory cell.

Each of select transistors T1 and T2 is formed of, for example, an n-channel metal oxide semiconductor field-effect transistor (MOSFET). Select transistors T1 and T2 are connected in parallel. One end of a parallel structure of the select transistors is connected to one end of the resistive memory element 10. The other end of the parallel structure of the select transistors is connected to bit line BL2. The other end of the resistive memory element 10 is connected to bit line BL1. Specifically, the first memory cell MC is connected between the two bit lines BL1 and BL2.

A second memory cell MC which is adjacent to the first memory cell MC in the row direction is connected between the two bit lines BL2 and BL3. The first memory cell MC and the second memory cell MC share bit line BL2. In addition, select transistors included in the second memory cell MC are connected to bit line BL2, and a resistive memory element 10 included in the second memory cell MC is connected to bit line BL3. Specifically, the resistive memory element 10 is disposed further outward than the select transistors as viewed from bit line BL2.

Select transistor T1 included in the first memory cell MC and select transistor T1 included in the second memory cell MC are connected to the same word line WL. In addition, select transistor T2 included in the first memory cell MC and select transistor T2 included in the second memory cell MC are connected to the same word line WL.

A third memory cell MC which is adjacent to the first memory cell MC in the column direction has the same connection relation as the first memory cell MC. In addition, the first memory cell MC and the third memory cell MC are arranged adjacent to each other in the column direction, and select transistor T2 of the first memory cell MC is connected in series with select transistor T1 of the third memory cell MC, such that nodes of them connected to bit line BL2 are connected to each other.

According to the above rules, memory cells of two rows which are connected between the three successive bit lines BL1 to BL3 are used as one column unit, and the column unit is repetitively provided along the row direction.

The resistive memory element 10 is formed to have at least two steady states which have different resistances. As the resistance-change memory, it is possible to use various types of memories, such as magnetoresistive random access memory (MRAM), phase-change random access memory (PCRAM), and resistive random access memory (ReRAM). This embodiment is explained with an example of using an MRAM as resistance-change memory, in particular, a spin-transfer MRAM which uses magnetization reversal caused by a polarization spin current. The MRAM utilizes as a memory element a magnetic tunnel junction (MTJ) element exploiting the tunneling magnetoresistive (TMR) effect, and stores data according to the magnetization state of the MTJ element.

Figure 2:
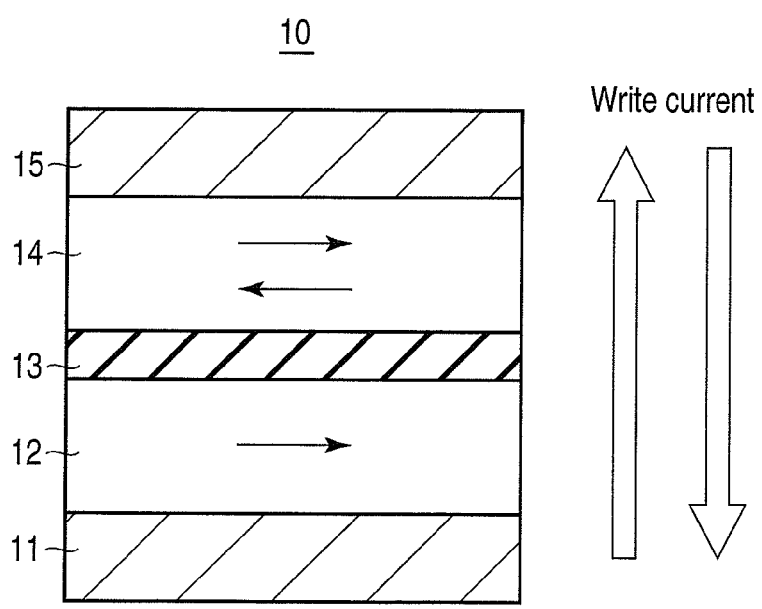
FIG. 2 is a cross-sectional view illustrating a structure of an MTJ element 10.

FIG. 2 is a cross-sectional view illustrating an example of a structure of the MTJ element 10. The MTJ element 10 has a laminated structure in which a lower electrode 11, a fixed layer (reference layer) 12, a non-magnetic layer 13, a recording layer (free layer) 14, and an upper electrode 15 are stacked in this order. The fixed layer 12 and the recording layer 14 may be layered in reverse order.

The recording layer 14 is formed of a ferromagnetic material, and the magnetization (or spin) direction thereof is variable (reversible). The fixed layer 12 is formed of a ferromagnetic material, and the magnetization direction thereof is fixed. This can be achieved by, for example, arranging an antiferromagnetic layer (not shown) between the fixed layer 12 and the lower electrode 11. An easy magnetization direction of the recording layer 14 and the fixed layer 12 may be perpendicular to the film surface (or the layering surface), or parallel to the film surface. In addition, the recording layer 14 may have a laminated structure formed of a plurality of layers.

FIGS. 3A and 3B are diagrams illustrating a low-resistance state and a high-resistance state of the MTJ element 10, respectively. When a current passing from the recording layer 14 to the fixed layer 12 is supplied to the MTJ element 10, the magnetization direction of the recording layer 14 is parallel (low-resistance state) to the magnetization direction of the fixed layer 12. In the parallel state, the resistance of the MTJ element 10 is minimum, and this state is defined as binary 0.

On the other hand, when a current passing from the fixed layer 12 to the recording layer 14 is supplied to the MTJ element 10, the magnetization direction of the recording layer 14 is antiparallel (high-resistance state) to the magnetization direction of the fixed layer 12. In the antiparallel state, the resistance of the MTJ element 10 is maximum, and this state is defined as binary 1. According to the above method, one bit can be recorded in the MTJ element 10.

Figure 5:
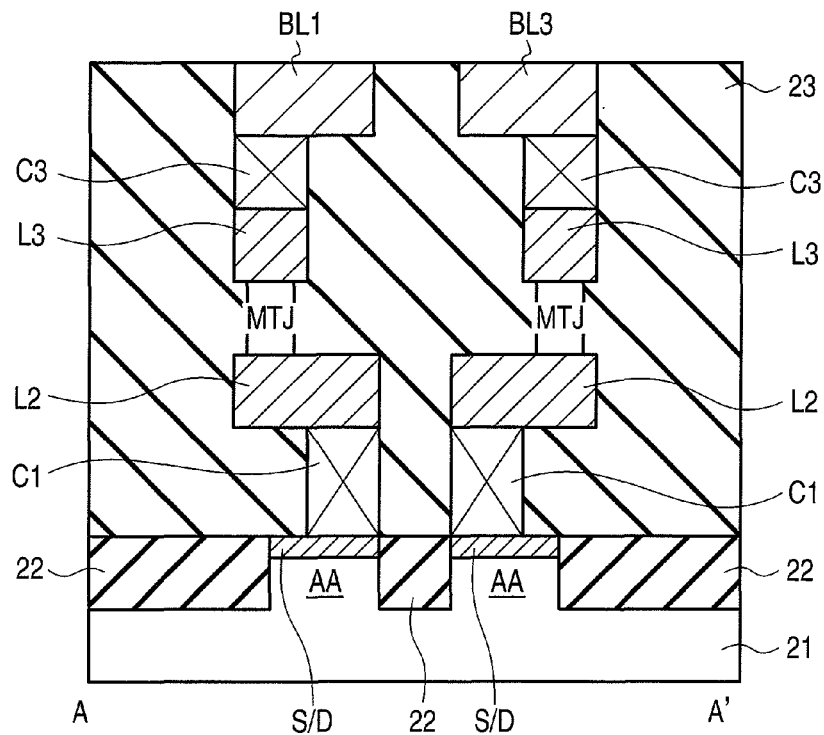
FIG. 5 is a cross-sectional view of the resistance-change memory taken along line A-A' in FIG. 4.
Figure 6:
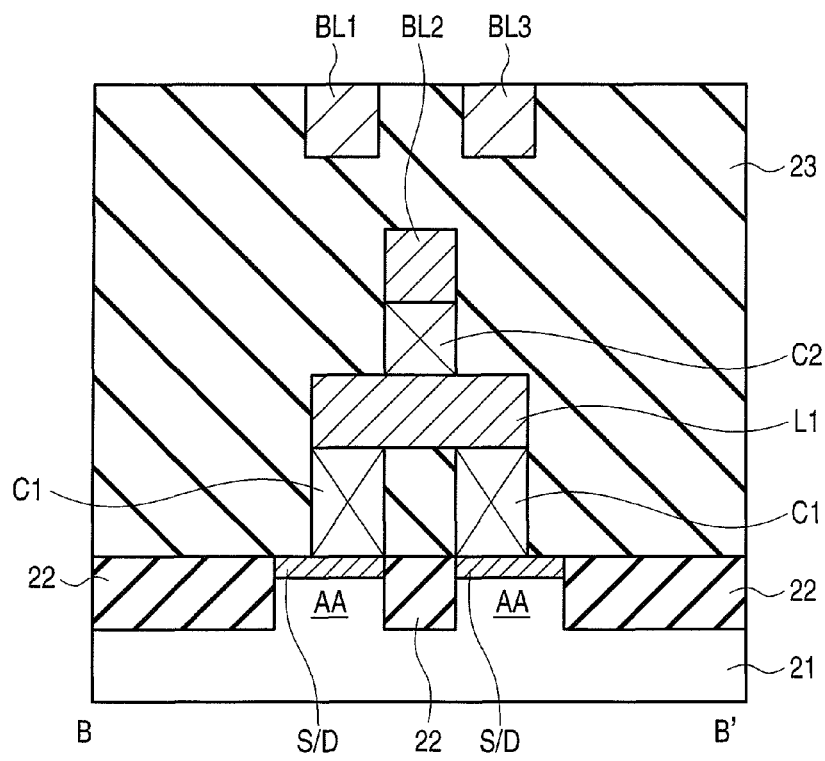
FIG. 6 is a cross-sectional view of the resistance-change memory taken along line B-B' in FIG. 4.
Figure 7:
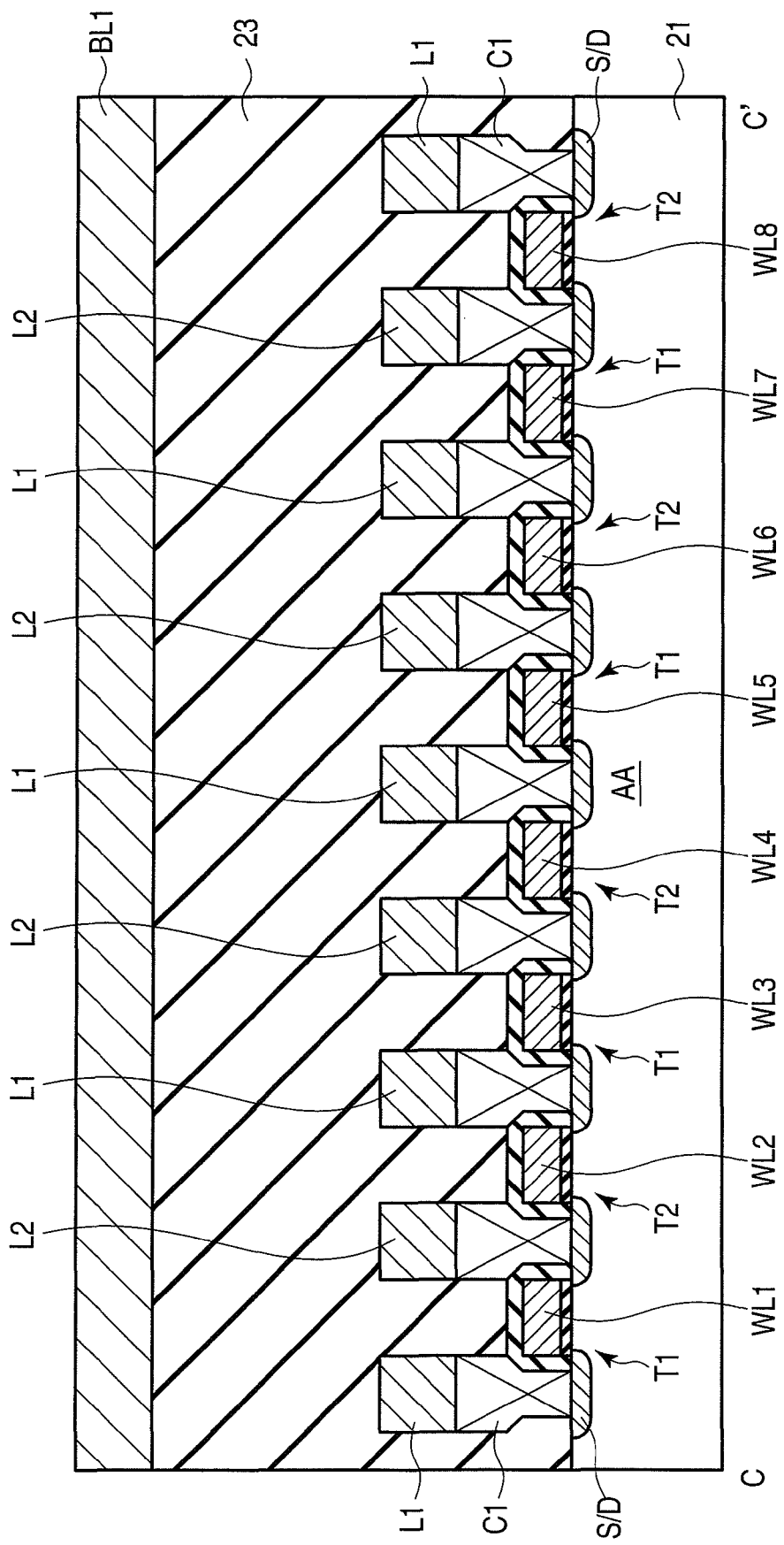
FIG. 7 is a cross-sectional view of the resistance-change memory taken along line C-C' in FIG. 4.

Next, layout of the resistance-change memory having the above structure is explained. FIG. 4 is a layout diagram of the resistance-change memory according to the first embodiment. FIG. 5 is a cross-sectional view of the resistance-change memory taken along line A-A' in FIG. 4. FIG. 6 is a cross-sectional view of the resistance-change memory taken along line B-B' in FIG. 4. FIG. 7 is a cross-sectional view of the resistance-change memory taken along line C-C' in FIG. 4. Each of broken lines each having a T-shape illustrated in FIG. 4 shows an area of a memory cell MC.

An element isolation insulating layer 22 is provided in a surface area of a P-type semiconductor substrate 21. Among the surface area, areas in which no element isolation insulating layer 22 is provided are active areas (element areas) AA in which elements such as transistors are formed. Each active area AA is provided in correspondence with memory cells of one column, and has a rectangular planar shape which extends in the column direction.

In each active area AA, select transistors T1 and select transistors T2 alternate with each other, and two adjacent select transistors are connected in series to share one diffusion region (source/drain region) S/D. Each select transistor is formed of two diffusion regions (source/drain regions) S/D which are formed apart in the active area AA, and a gate electrode (word line) WL which is formed on the active area AA located between the diffusion regions S/D with a gate insulating film interposed therebetween and extends in the row direction. A contact plug C1 is provided on each diffusion region S/D. FIG. 8 is a layout diagram illustrating a part from the active areas AA to contact plugs C1, which is extracted from FIG. 4. Although FIG. 8 shows an example in which contact plugs C1 are formed by the self-aligned contact (SAC) process, contact plugs C1 may be formed by another method.

A contact layer L1 formed of a conductor such as metal is formed on each of contact plugs C1 of odd numbers in the column direction. Each contact layer L1 extends in the row direction, and connects two diffusion regions S/D which are adjacent in the row direction. A contact plug C2 is provided on the central portion of each contact layer L1. Bit line BL2 extending in the column direction is provided on a plurality of contact plugs C2, to connect contact plugs C2.

A contact layer L2 formed of a conductor is formed on each of contact plugs C1 of even numbers in the column direction. Each contact layer L2 extends in the row direction, and is drawn in a direction away from bit line BL2. An MTJ element 10 is provided on each contact layer L2. A contact layer L3 formed of a conductor such as metal is formed on each MTJ element 10. Contact layers L1 and L2 belong to a first-level interconnect layer. To simplify the process, contact layers L1 and L2 are preferably formed of the same material and by the same process. Bit line BL2 and contact layers L3 belong to a second-level interconnect layer. FIG. 9 is a layout diagram illustrating a part from contact plugs C1 to the second-level interconnect layer, which is extracted from FIG. 4.

Figure 10:
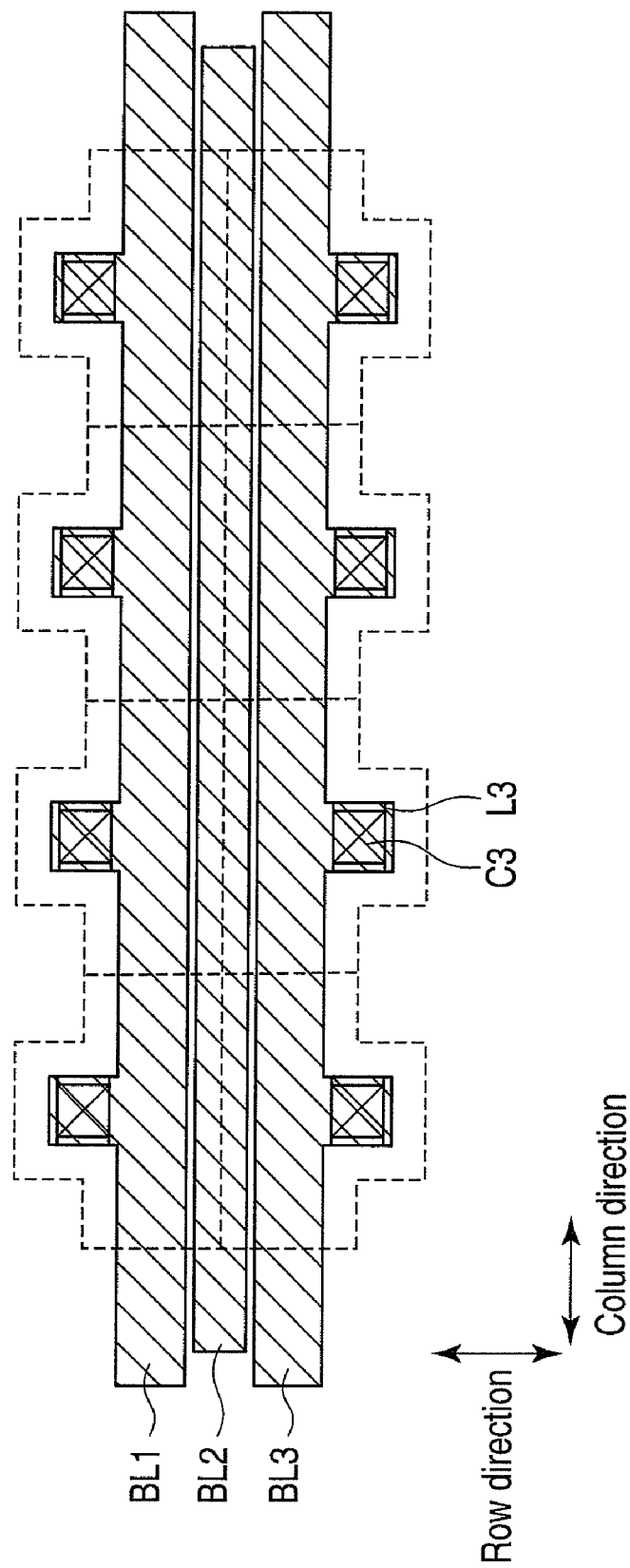
FIG. 10 is a layout diagram illustrating layers being a part of the structure of FIG. 4 and extracted from FIG. 4.

A contact plug C3 is provided on each contact layer L3. Bit line BL1 extending in the column direction is provided on a plurality of contact plugs C3, to connect contact plugs C3. Specifically, bit line BL1 is formed of an extending portion which extends in the column direction, and projecting portions which projects in the row direction at the positions of the respective contact plugs C3. Bit line BL3 has the same structure as bit line BL1. Bit lines BL1 and BL3 belong to a third-level interconnect layer. FIG. 10 is a layout diagram illustrating a part from the second-level interconnect layer to the third-level interconnect layer, which is extracted from FIG. 4.

As described above, one basic structure (column unit) which is formed of two columns and three bit lines BL1 to BL3 is formed. A memory cell array is formed by arranging a plurality of column units, one of which is illustrated in FIG. 4, in the row direction. A space between the P-type semiconductor substrate 21 and the third-level interconnect layer is filled with an interlayer insulating layer 23. Although the drawings show an example of using one interlayer insulating material, a material having a low dielectric constant may partly be used to reduce the capacitance between interconnects.

Figure 11:
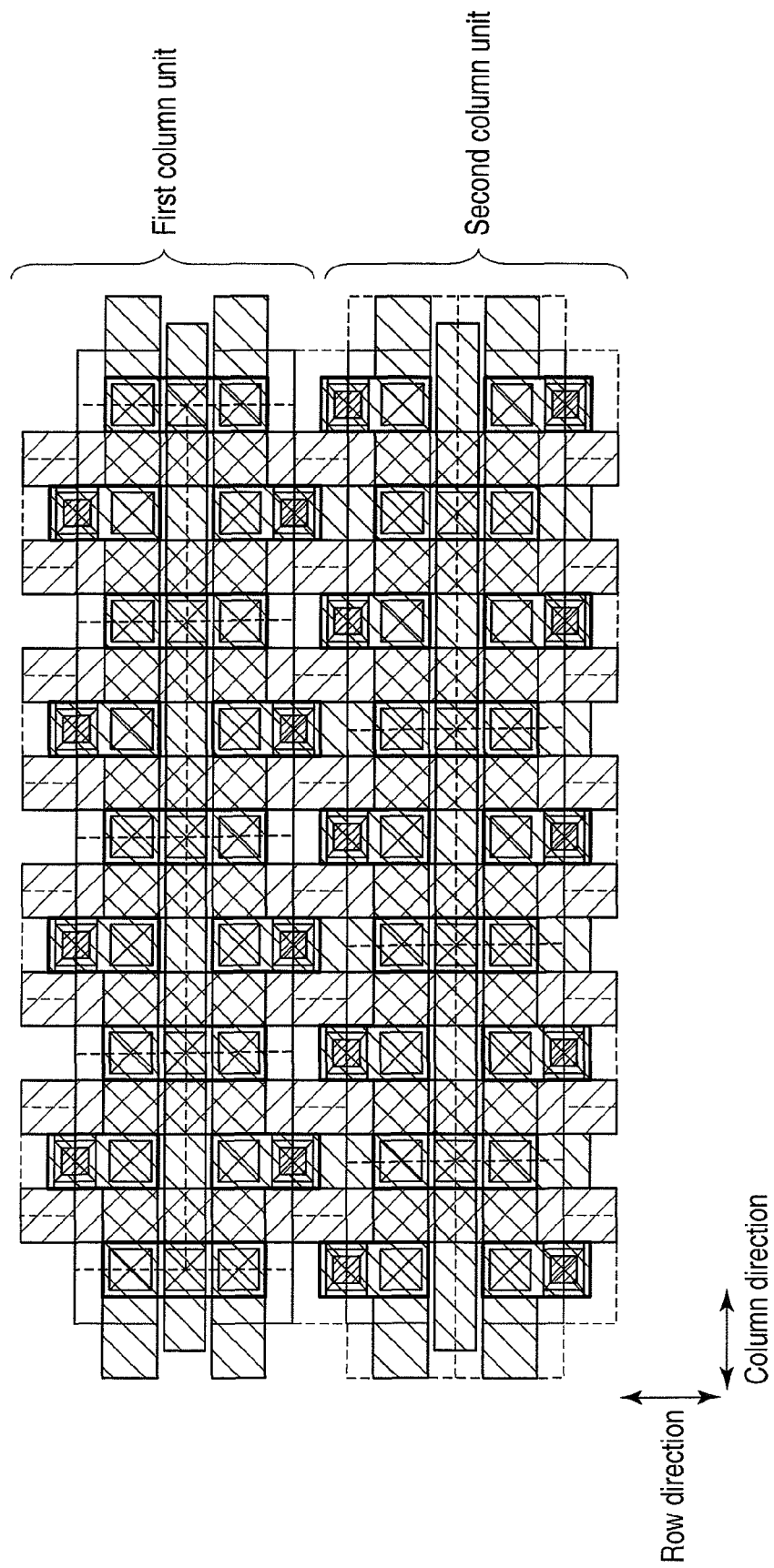
FIG. 11 is a layout diagram illustrating two column units arranged in a row direction.

FIG. 11 is a layout diagram illustrating two column units arranged in the row direction. The first column unit and the second column unit which are adjacent in the row direction are arranged such that projecting portions and recessed portions of broken lines illustrating the areas of memory cells MC are engaged with one another. Specifically, the second column unit is shifted from the first column unit in the column direction only by ½ (one word line) the arrangement pitch of the memory cells. Therefore, a word line connected to a select transistor T1 of the first column unit is connected to a word line of a select transistor T2 of the second column unit.

As detailed above, according to the first embodiment, in a resistance-change memory having 2T1R memory cells MC each including two select transistors T1 and T2 and one resistive memory element 10, a group of memory cells for one column are arranged between bit lines BL1 and BL2 among three successive bit lines BL1 to BL3, and a group of memory cells MC for one column are arranged between bit lines BL2 and BL3. Then, the two groups of memory cells share bit line BL2. In addition, the resistive memory elements 10 are arranged further outward than the select transistors as viewed from bit line BL2. In addition, bit lines BL1 and BL3 are formed by using an interconnect layer further upward than bit line BL2, and arranged close to the center of the column unit.

Therefore, according to the first embodiment, it is possible to reduce the layout area of a 2T1R memory cell MC to $10F^2$. The symbol "F" denotes a minimum feature size. This structure enables reduction in the chip size, and it is possible to achieve the semiconductor memory device of low cost.

(Second Embodiment)

In a second embodiment, two column units of the first embodiments are arranged adjacent to each other in the row direction, and the two column units share a bit line between them. Specifically, when a plurality of memory cells MC arranged in line in the column direction is one column, the second embodiment shows an example in which four columns form a basic structure (column unit), sharing adjacent bit lines BL.

FIG. 12 is a circuit diagram of a resistance-change memory according to the second embodiment. Each memory cell is of 2T1R type as in the first embodiment, and is formed of two select transistors T1 and T2 and one resistive memory element (MTJ element) 10. In a memory cell array section, arranged are bit lines BL1 to BL5 each extending in the column direction, and word lines WL1 to WL8 each extending in the row direction perpendicular to the column direction.

A group of memory cells (column) arranged in the column direction are connected between two adjacent bit lines. Specifically, four columns are arranged between bit lines BL1 and BL5.

A first column, in which MTJ elements 10 are connected to bit line BL1, and a second column, in which MTJ elements 10 are connected to bit line BL3, share bit line BL2. The select transistors included in the first column and the select transistors included in the second column are connected to bit line BL2. Specifically, the MTJ elements 10 are arranged further outward than the select transistors as viewed from bit line BL2.

A third column, in which MTJ elements 10 are connected to bit line BL3, and a fourth column, in which MTJ elements 10 are connected to bit line BL5, share bit line BL4. The select transistors included in the third column and the select transistors included in the fourth column are connected to bit line BL4. Specifically, the MTJ elements 10 are arranged further outward than the select transistors as viewed from bit line BL4.

In addition, the second column and the third column share bit line BL3. Specifically, the MTJ elements 10 included in the second column and the MTJ elements 10 included in the third column are connected to the shared bit line BL3.

Select transistors T1 included in the first column and the corresponding select transistors T1 included in the second column are connected to the same respective word lines WL. Select transistors T2 included in the first column and the corresponding select transistors T2 included in the second column are connected to the same respective word lines WL.

Select transistors T1 included in the third column and the corresponding select transistors T1 included in the fourth column are connected to the same respective word lines WL. Select transistors T2 included in the third column and the corresponding select transistors T2 included in the fourth column are connected to the same respective word lines WL.

The third column (or fourth column) is shifted from the first column (or second column) in the column direction only by one word line WL. Specifically, a word line connected to a select transistor T1 included in the first column (or second column) is connected to a select transistor T2 included in the third column (or fourth column). In view of memory cells, the memory cells belonging to the third column (or fourth column) are shifted from the memory cells belonging to the first column (or second column) in the column direction by ½ the arrangement pitch of the memory cells. A column unit is formed by the four columns.

Figure 15:
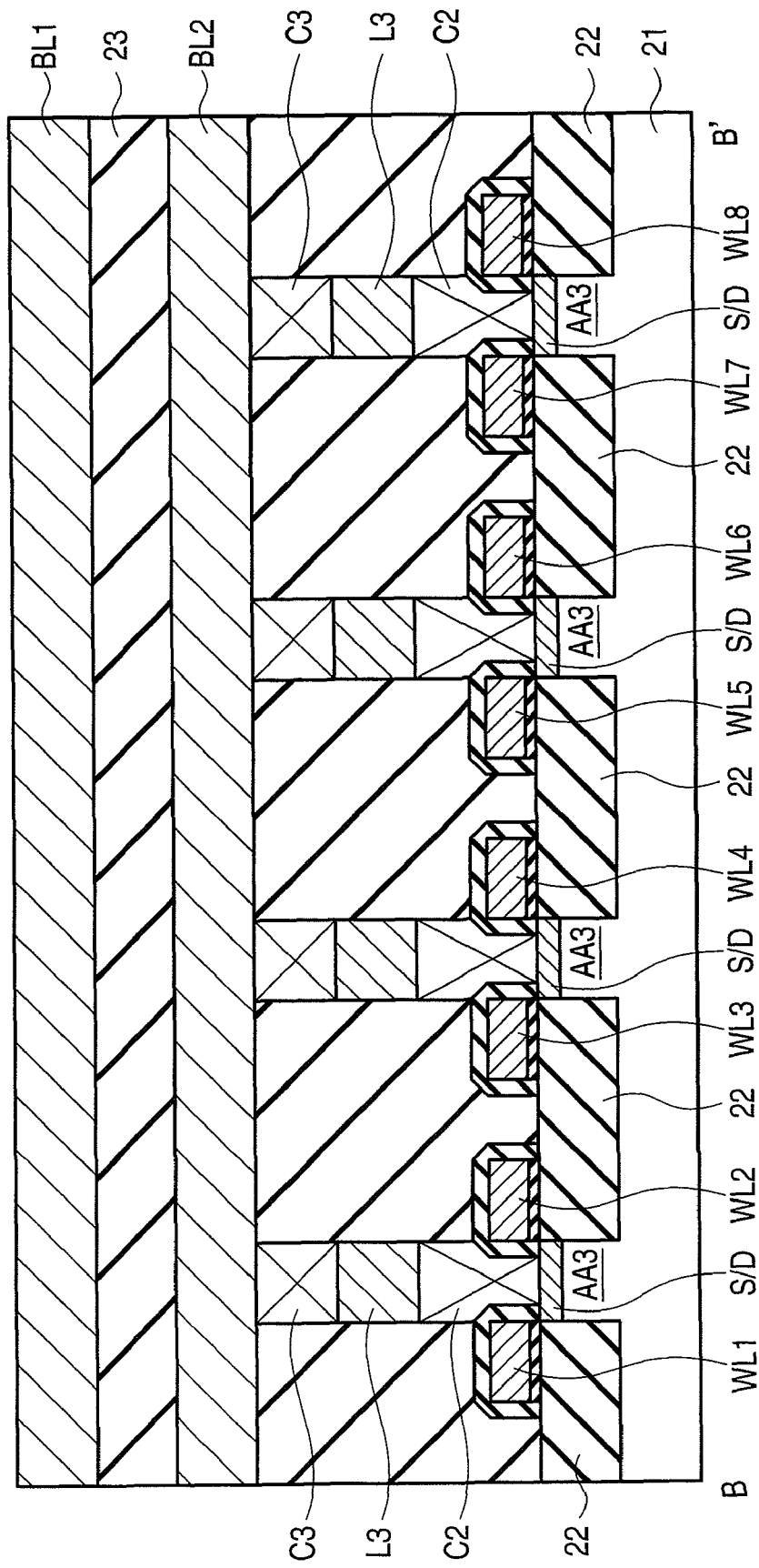
FIG. 15 is a cross-sectional view of the resistance-change memory taken along line B-B' in FIG. 13.

The following is an explanation of layout of the resistance-change memory having the above structure. FIG. 13 is a layout diagram of the resistance-change memory. FIG. 14 is a cross-sectional view of the resistance-change memory taken along line A-A' in FIG. 13. FIG. 15 is a cross-sectional view of the resistance-change memory taken along line B-B' in FIG. 13.

Figure 16:
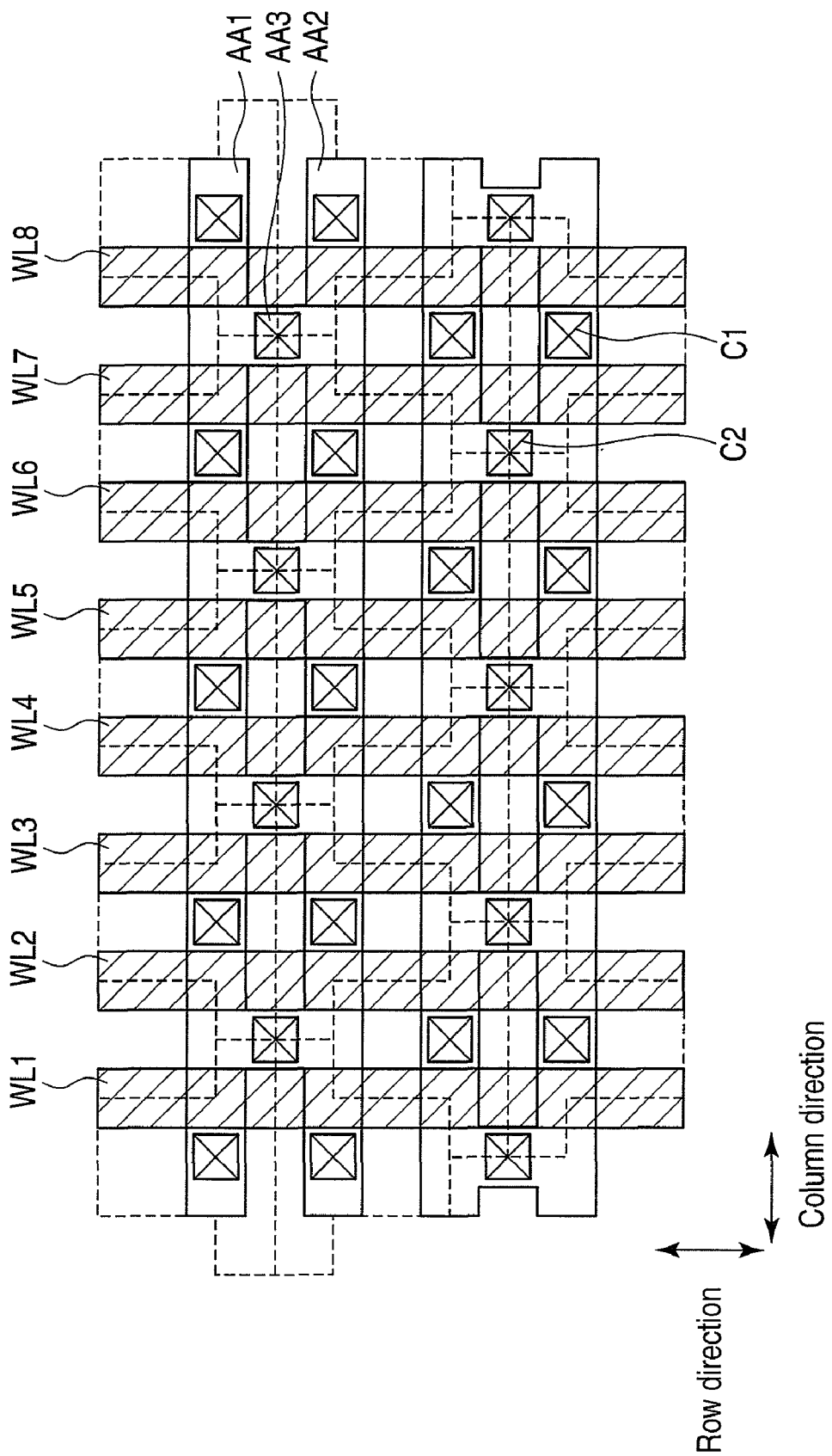
FIG. 16 is a layout diagram of layers being a part of the structure of FIG. 13 and extracted from FIG. 13.

In a surface area of a P-type semiconductor substrate 21, formed are an active area AA1 in which the select transistors included in the first column are formed, and an active area AA2 in which the select transistors included in the second column are formed. Each of active areas AA1 and AA2 has a rectangular planar shape extending in the column direction. Active areas AA3 connecting active areas AA1 and AA2 are provided in areas of the semiconductor substrate 21 between word lines WL1 and WL2, between word lines WL3 and WL4, between word lines WL5 and WL6, and between word line WL7 and WL8. Specifically, active areas AA1 to AA3 form a ladder shape as a whole. FIG. 16 is a layout diagram of a part from the active areas AA to contact plugs C1, which is extracted from FIG. 13. Diffusion regions (source/drain regions) S/D for select transistors are formed in parts of active areas AA1 to AA3, which do not overlap the word lines WL.

Contact plugs C2 are provided on active areas AA3. Contact plugs C1 are provided on active areas AA1 and AA2.

Contact layers L1 which are drawn in a direction away from bit line BL2 are provided on contact plugs C1 included in the first column. MTJ elements 10 included in the first column are provided on contact layers L1. Contact layers L3 are provided on the MTJ elements 10.

Contact layers L2 are provided on contact plugs C2. Contact plugs C3 are provided on contact layers L2. Bit line BL2 extending in the column direction is provided on contact plugs C3 to connect active areas AA3.

Contact layers L1 which are drawn in a direction away from bit line BL2 are provided on contact plugs C1 included in the second column. MTJ elements 10 included in the second column are provided on contact layers L1. Bit line BL3 extending in the column direction is provided on the MTJ elements 10.

Figure 17:
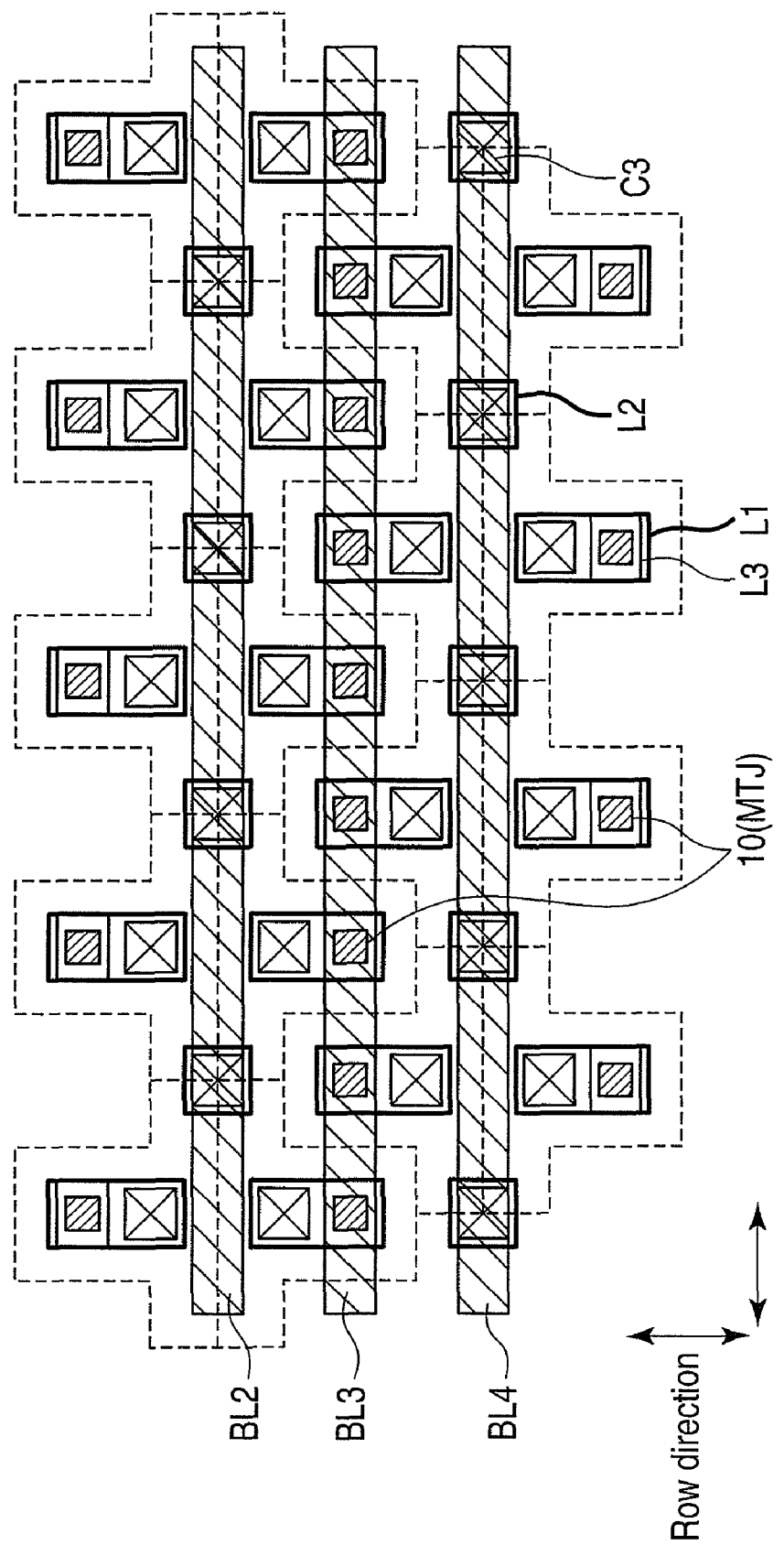
FIG. 17 is a layout diagram of layers being a part of the structure of FIG. 13 and extracted from FIG. 13.

Contact layers L1 and L2 belong to a first-level interconnect layer. Bit lines BL2 to BL4 and contact layers L3 belong to a second-level interconnect layer. FIG. 17 is a layout diagram illustrating a part from contact plugs C1 to the second-level interconnect layer, which is extracted from FIG. 13. The third column and the fourth column have a structure obtained by arranging the first column and the second column in line symmetry in the row direction, and shifting them in the column direction by one word line. In addition, the MTJ elements 10 included in the second column and the MTJ elements 10 included in the third column are arranged adjacent to each other in the column direction.

Contact plugs C4 are provided on contact layers L3. Bit line BL1 extending in the column direction is provided on contact plugs C4 included in the first column, to connect contact plugs C4 included in the first column. Specifically, bit line BL1 is formed of an extending portion extending in the column direction, and projecting portions which project in the row direction at positions of the respective contact plugs C4. Specifically, the extending portion included in bit line BL1 is disposed close to the center of the column unit.

Figure 18:
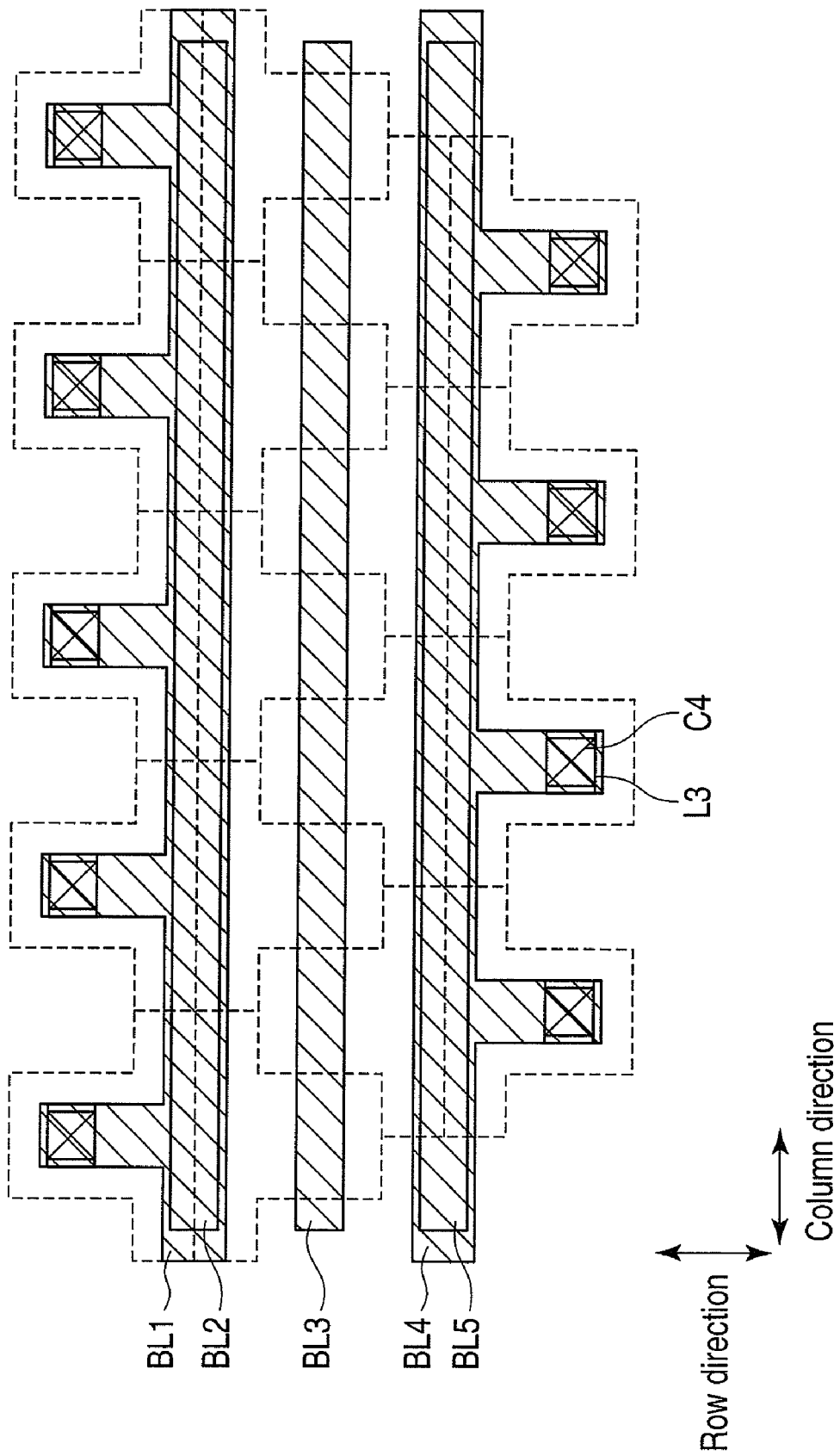
FIG. 18 is a layout diagram of layers being a part of the structure of FIG. 13 and extracted from FIG. 13.

In the same manner, bit line BL5 extending in the column direction is provided on contact plugs C4 included in the fourth column, to connect contact plugs C4 included in the fourth column. Specifically, bit line BL5 is formed of an extending portion extending in the column direction, and projecting portions which project in the row direction at positions of the respective contact plugs C4. Specifically, the extending portion included in bit line BL5 is disposed close to the center of the column unit. Bit lines BL1 and BL5 belong to a third-level interconnect layer. FIG. 18 is a layout diagram illustrating a part from the second-level interconnect layer to the third-level interconnect layer, which is extracted from FIG. 13.

As described above, a column unit formed of four columns and five bit lines BL1 to BL5 is formed. Then, a memory cell array is formed by arranging a plurality of column units, one of which is illustrated in FIG. 13, in the row direction.

FIG. 19 is a layout diagram illustrating two column units arranged in the row direction. A first column unit and a second column unit which are adjacent to each other in the row direction are arranged such that projecting portions and recessed portions of broken lines illustrating areas of the memory cells MC are engaged with one another. The first column unit and the second column unit are connected to the same word lines.

As detailed above, according to the second embodiment, a group of memory cells for one column are provided between each pair of adjacent bit lines among the five successive bit lines BL1 to BL5, to form one column unit. Adjacent memory cell groups share a bit line between them. In addition, in the first column and the second column, the resistive memory elements 10 are arranged further outward than the select transistors as viewed from bit line BL2. In the third column and the fourth column, the resistive memory elements 10 are arranged further outward than the select transistors as viewed from bit line BL4. In addition, bit lines BL1 and BL5 arranged on the both sides of the column unit are formed by using an interconnect layer further upward than bit lines BL2 to BL4, and arranged close to the center of the column unit.

Therefore, according to the second embodiment, the layout area of a 2T1R memory cell can be reduced to $8F^2$. This enables reduction in the chip size, and it is possible to realize the semiconductor memory device of lower cost.

(Third Embodiment)

A third embodiment shows an example of forming a basic structure (column unit) in which two columns share a bit line BL located between them, when a plurality of memory cells arranged in line in the column direction form one column. In addition, unlike the first embodiment, the third embodiment has a structure in which select transistors are arranged further outward than MTJ elements as viewed from a bit line located in the center of the column unit.

Figure 20:
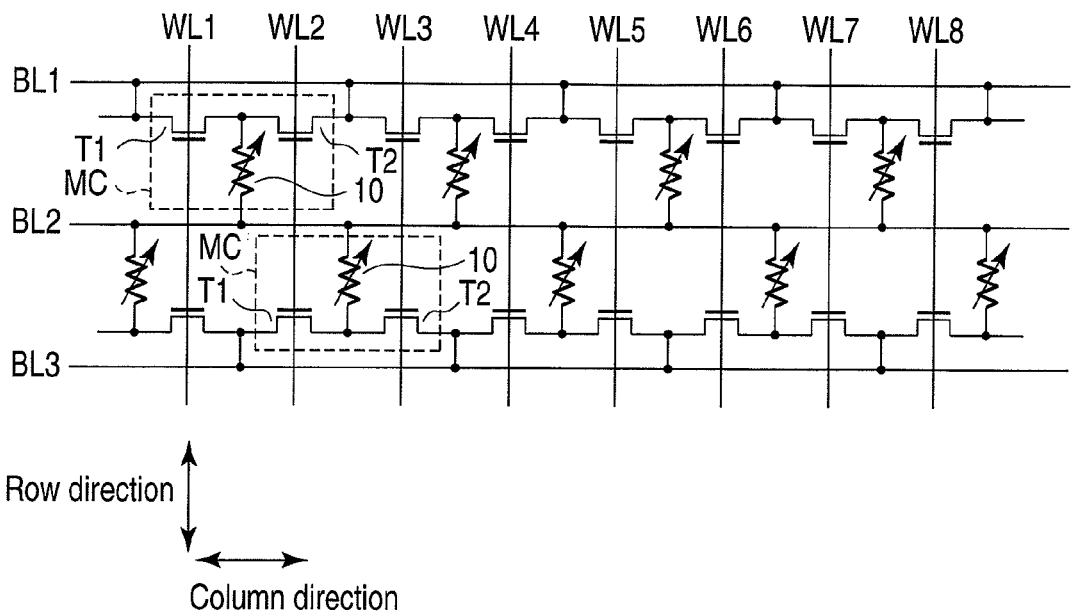
FIG. 20 is a circuit diagram of a resistance-change memory according to a third embodiment.

FIG. 20 is a circuit diagram of a resistance-change memory according to the third embodiment. Each memory cell MC is of 2T1R type like the first embodiment, and formed of two select transistors T1 and T2 and one resistive memory element (MTJ element) 10. In a memory cell array section, arranged are bit lines BL1 to BL3 each extending in the column direction, and word lines WL1 to WL8 each extending in the row direction perpendicular to the column direction.

A group of memory cells (first column) arranged in the column direction are connected between bit lines BL1 and BL2. A second column is connected between bit lines BL2 and BL3. Specifically, bit line BL2 is shared between the first column and the second column. One column unit is formed of the two columns and the three bit lines BL1 to BL3.

MTJ elements 10 included in the first column are connected to bit line BL2. Select transistors included in the first column are connected to bit line BL1. MTJ elements 10 included in the second column are connected to bit line BL2. Select transistors included in the second column are connected to bit line BL3.

The second column is shifted from the first column in the column direction only by one word line. Specifically, a select transistor T1 included in the first column and a select transistor T2 included in the second column are connected to the same word line WL. A select transistor T2 included in the first column and a select transistor T1 included in the second column are connected to the same word line WL. In view of the memory cells, the memory cells included in the second column are shifted in the column direction from the memory cells included in the first column by ½ the arrangement pitch of the memory cells.

Figure 22:
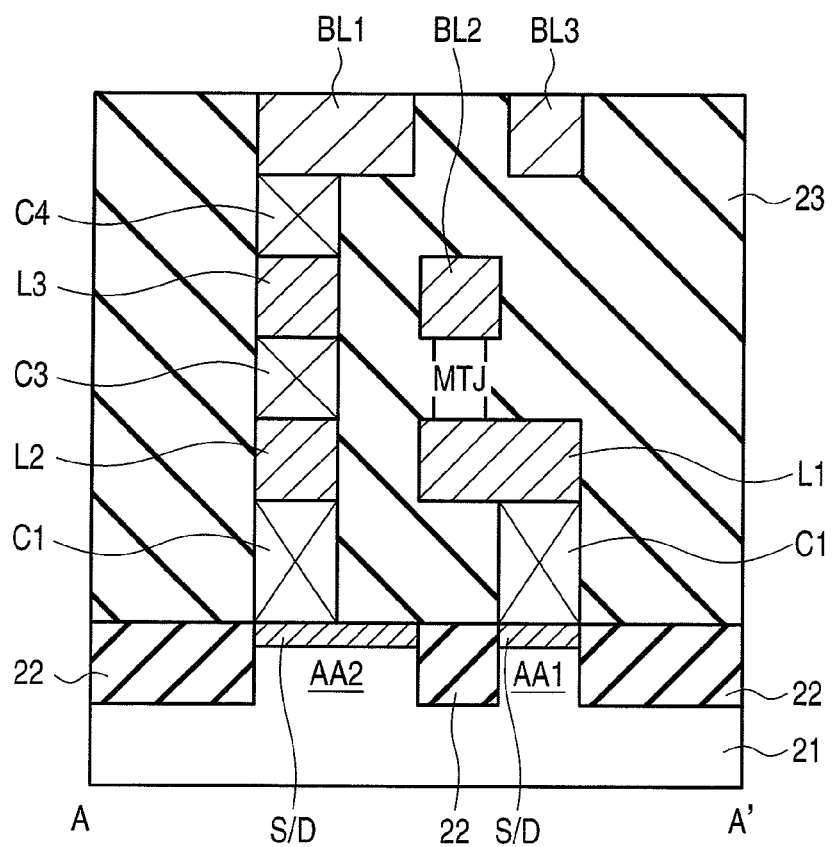
FIG. 22 is a cross-sectional view of the resistance-change memory taken along line A-A' in FIG. 21.
Figure 23:
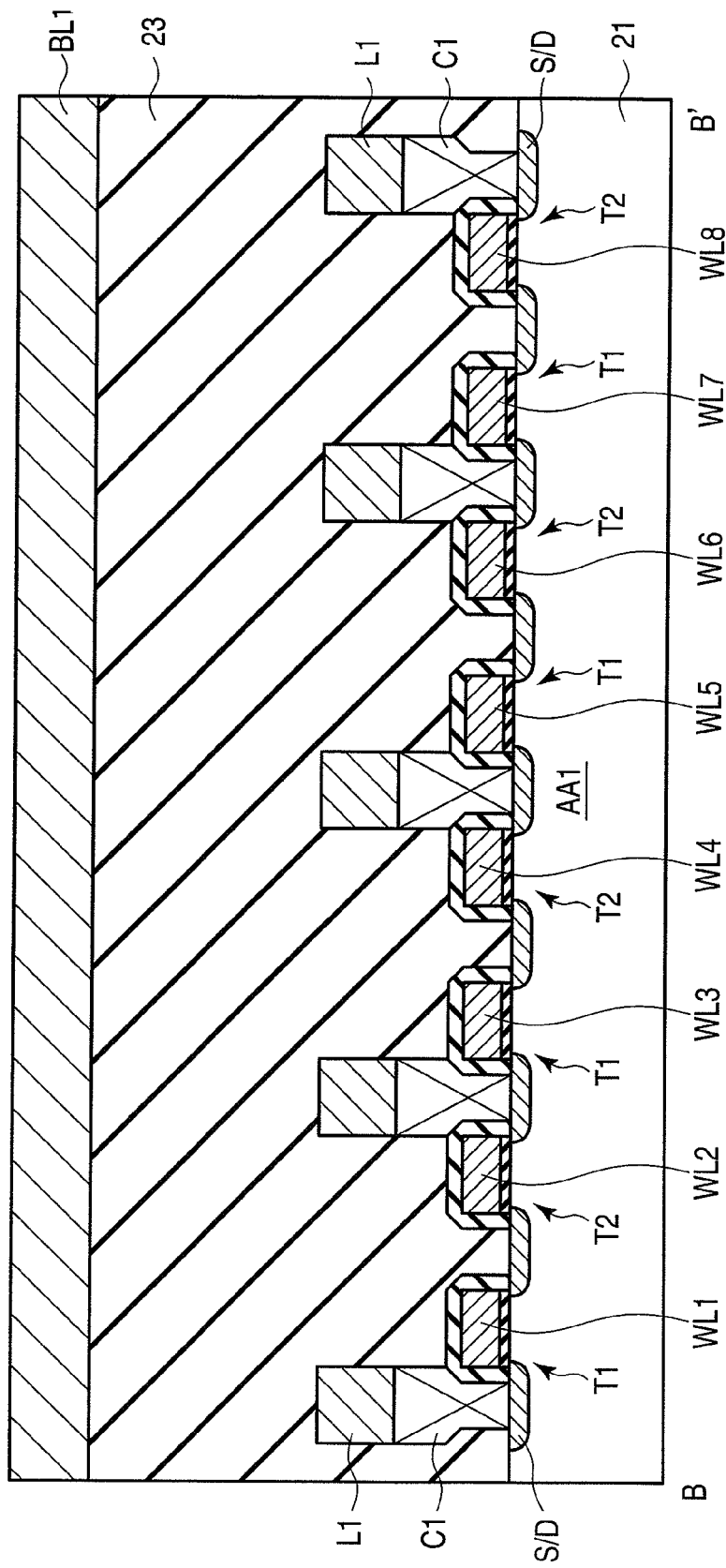
FIG. 23 is a cross-sectional view of the resistance-change memory taken along line B-B' in FIG. 21.

Next, layout of the resistance-change memory having the above structure is explained. FIG. 21 is a layout diagram of the resistance-change memory. FIG. 22 is a cross-sectional view of the resistance-change memory taken along line A-A' in FIG. 21. FIG. 23 is a cross-sectional view of the resistance-change memory taken along line B-B' in FIG. 21.

Figure 24:
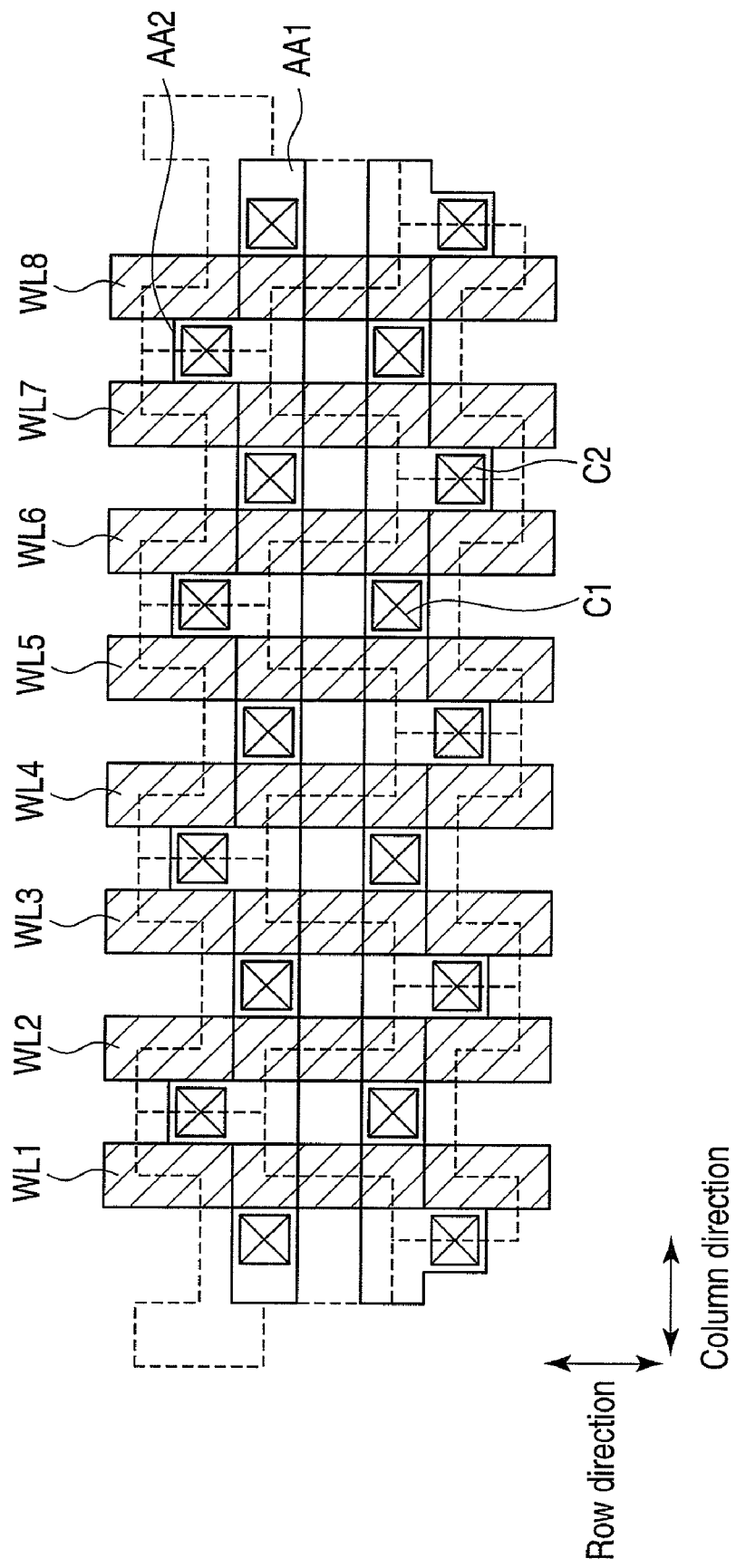
FIG. 24 is a layout diagram of layers being a part of the structure of FIG. 21 and extracted from FIG. 21.

In a surface area of a P-type semiconductor substrate 21, an active area AA1 in which select transistors included in the first column is provided. Active area AA1 has a rectangular planar shape extending in the column direction. Active areas AA2 which projects from active area AA1 in the row direction are provided in parts of the semiconductor substrate 21, which are located between word lines WL1 and WL2, between word lines WL3 and WL4, between word lines WL5 and WL6, and between word lines WL7 and WL8. Active areas AA2 are connected to active area AA1. FIG. 24 is a layout diagram illustrating a part from the active areas AA to contact plugs C1 and C2, which is extracted from FIG. 21. Diffusion regions (source/drain regions) S/D for select transistors are formed in parts of active areas AA1 and AA2, which do not overlap the word lines WL.

Contact plugs C2 are provided on active areas AA2. In addition, contact plugs C1 are provided in parts of active area AA1 located between the word lines WL, in which no active areas AA2 exist.

Contact layers L1 which is drawn toward the center of the column unit are provided on contact plugs C1. MTJ elements 10 are provided on contact layers L1. Bit line BL2 extending in the column direction is provided on the MTJ elements 10, to connect the MTJ elements 10. Contact layers L2 are provided on contact plugs C2. Contact plugs C3 are provided on contact layers L2. Contact layers L3 are provided on contact plugs C3. Contact layers L1 and L2 belong to a first-level interconnect layer. Bit line BL2 and contact layers L3 belong to a second-level interconnect layer. FIG. 25 is a layout diagram illustrating a part from contact plugs C1 to the second-level interconnect layer, which is extracted from FIG. 21.

Contact plugs C4 are provided on contact layers L3. Bit line BL1 extending in the column direction is provided on contact plugs C4 included in the first column, to connect contact plugs C4. Specifically, bit line BL1 is formed of an extending portion extending in the column direction, and projecting portions which project in the row direction at positions of the respective contact plugs C4. In other words, the extending portion included in bit line BL1 is disposed close to the center of the column unit.

Figure 26:
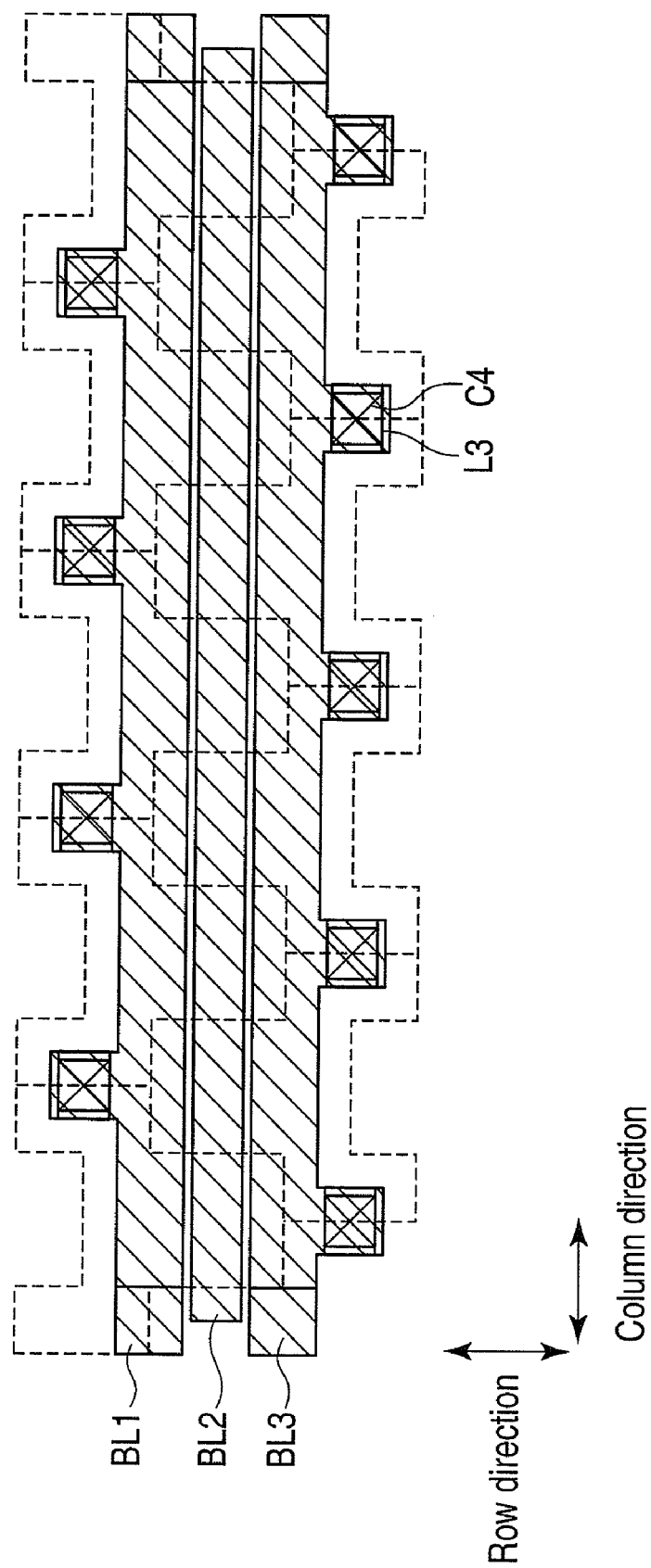
FIG. 26 is a layout diagram of layers being a part of the structure of FIG. 21 and extracted from FIG. 21.

In the same manner, bit line BL3 extending in the column direction is provided on contact plugs C4 included in the second column, to connect contact plugs C4. Specifically, bit line BL3 is formed of an extending portion extending in the column direction, and projecting portions which project in the row direction at positions of the respective contact plugs C4. Specifically, the extending portion included in bit line BL3 is disposed close to the center of the column unit. FIG. 26 is a layout diagram illustrating a part from the second-level interconnect layer to the third-level interconnect layer, which is extracted from FIG. 21.

As described above, formed is one column unit which is formed of two columns and three bit lines BL1 to BL3. A memory cell array is formed by arranging a plurality of column units, one of which is illustrated in FIG. 21, in the row direction.

Figure 27:
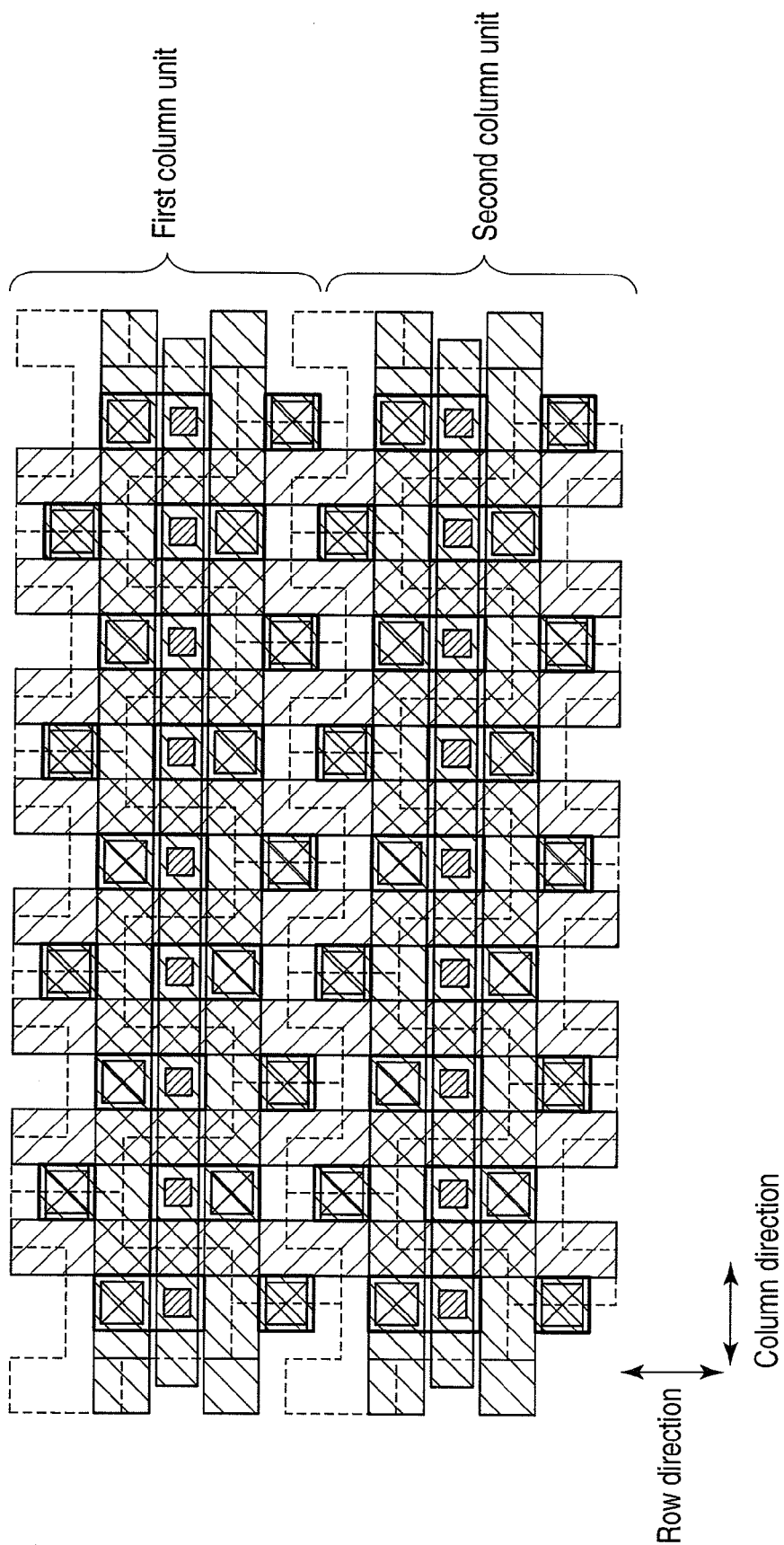
FIG. 27 is a layout diagram illustrating two column units arranged in a row direction.

FIG. 27 is a layout diagram illustrating two column units arranged in the row direction. A first column unit and a second column unit which are adjacent in the row direction are arranged such that projecting portions and recessed portions of broken lines indicating areas of the memory cells MC are engaged with one another. The first column unit and the second column unit are connected to the same word lines.

As detailed above, according to the third embodiment, two columns shares center bit line BL2 among the three successive bit lines BL1 to BL3. In addition, select transistors T1 and T2 are arranged further outward than the MTJ elements 10 as viewed from bit line BL2.

Therefore, according to the third embodiment, it is possible to reduce the layout area of a 2T1R memory cell MC to 10F$^2$, in the same manner as the first embodiment. This structure enables reduction in the chip size, and it is possible to realize the semiconductor memory device of lower cost.

(Fourth Embodiment)

A fourth embodiment is a modification of the second embodiment. In the fourth embodiment, active areas AA are formed in a stripe pattern. In addition, bit lines BL1 and BL5 located on the both sides are formed by using a fourth-level interconnect layer. The circuit diagram of a resistance-change memory according to the fourth embodiment is the same as FIG. 12.

Figure 28:
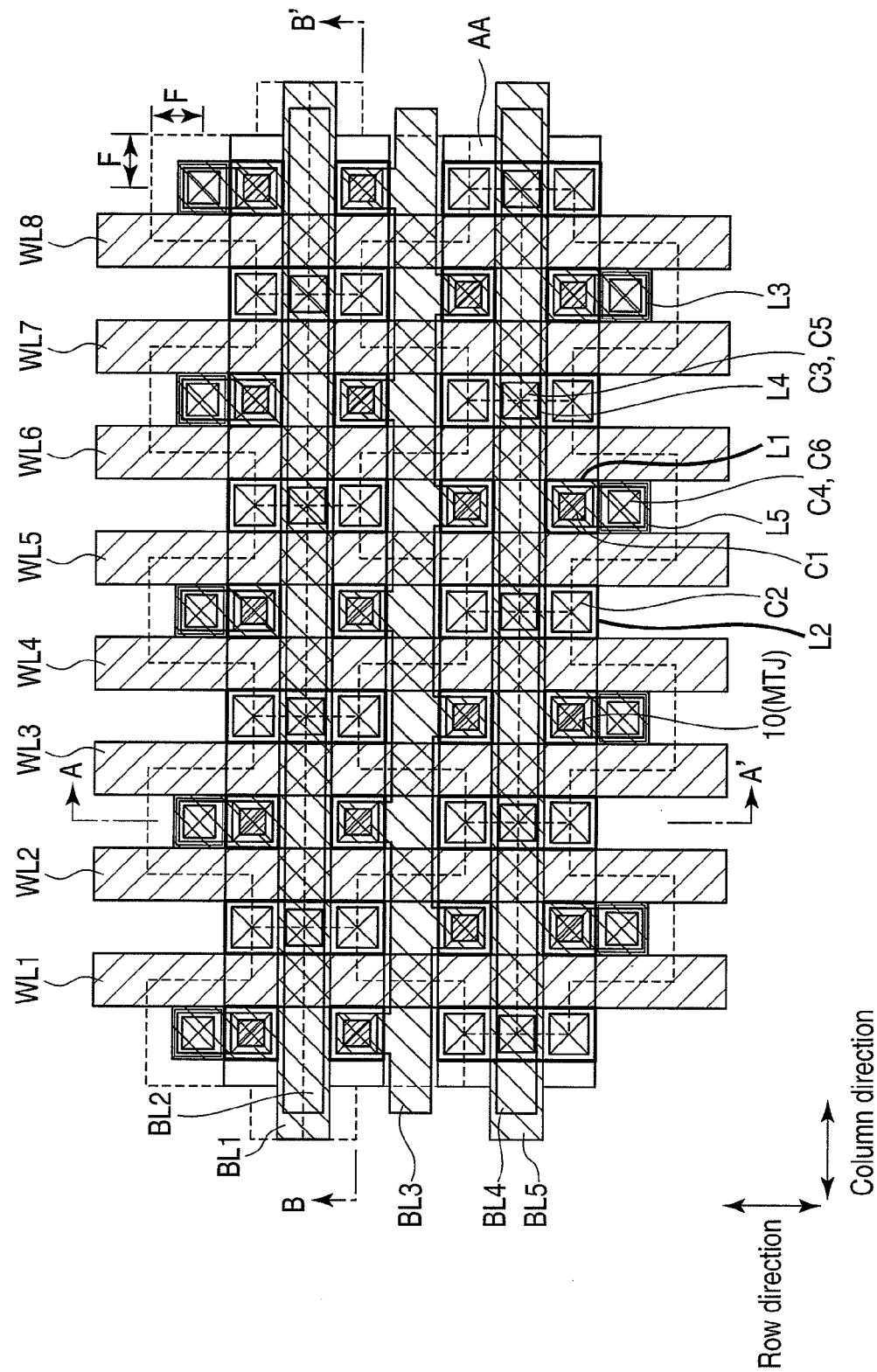
FIG. 28 is a layout diagram of a resistance-change memory according to a fourth embodiment.
Figure 29:
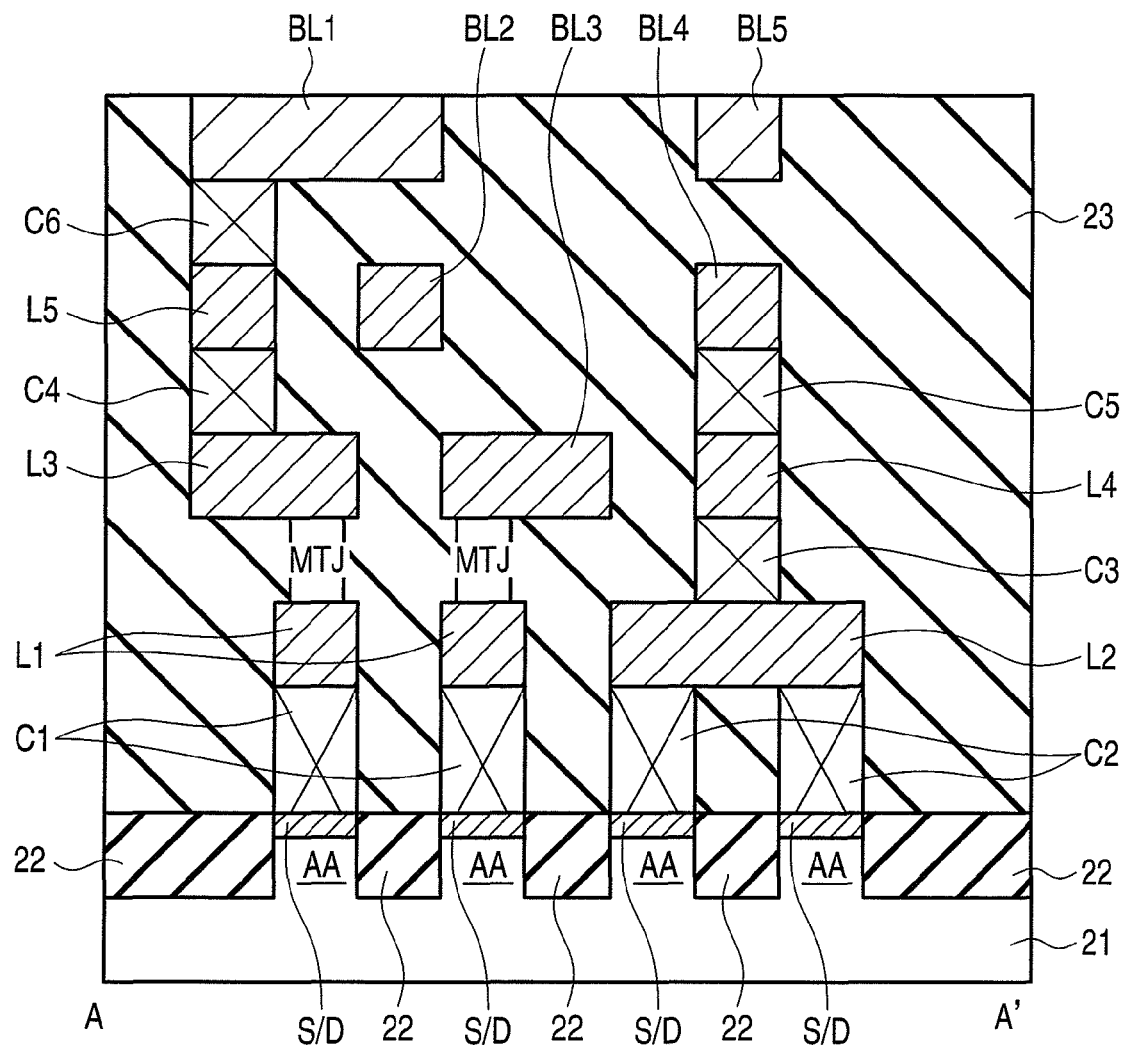
FIG. 29 is a cross-sectional view of the resistance-change memory taken along line A-A' in FIG. 28.
Figure 30:
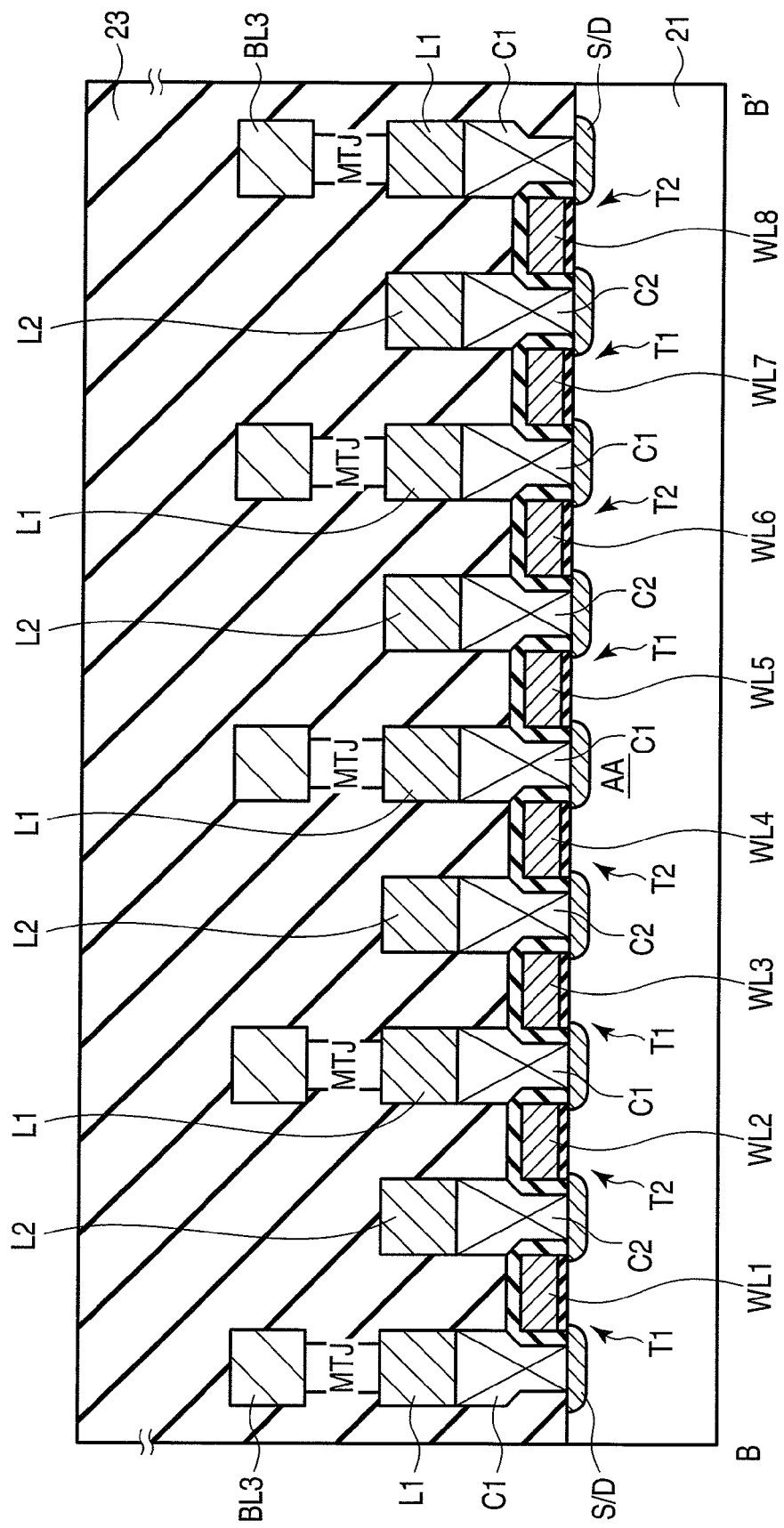
FIG. 30 is a cross-sectional view of the resistance-change memory taken along line B-B' in FIG. 28.

FIG. 28 is a layout diagram of the resistance-change memory according to the fourth embodiment. FIG. 29 is a cross-sectional view of the resistance-change memory taken along line A-A' in FIG. 28. FIG. 30 is a cross-sectional view of the resistance-change memory taken along line B-B' in FIG. 28.

In a surface area of a P-type semiconductor substrate 21, four active areas AA corresponding to four columns are provided in a stripe pattern. Each active area AA has a rectangular planar shape extending in the column direction.

Diffusion regions (source/drain regions) S/D for select transistors are provided on parts of the active areas AA, which do not overlap word lines WL. Contact plugs C1 and C2 are alternately provided on the diffusion regions. FIG. 31 is a layout diagram illustrating a part from the active areas AA to contact plugs C1 and C2, which is extracted from FIG. 28.

Contact layers L1 are provided on contact plugs C1 included in the first column. MTJ elements 10 included in the first column are provided on contact layers L1. Contact layers L3 which are drawn in a direction away from the center of the column unit and included in the first column are provided on the MTJ elements 10.

Contact layers L1 are provided on contact plugs C1 included in the first column. MTJ elements 10 included in the second column are provided on contact layers L1. A bit line BL3 extending in the column direction is provided on the MTJ elements 10 included in the second column, to connect the MTJ elements 10 included in the second column. Specifically, bit line BL3 is formed of an extending portion extending in the column direction, and projecting portions which project in the row direction at positions of the respective MTJ elements 10. In other words, the extending portion included in bit line BL3 is disposed close to the center of the column unit.

Contact layers L2 are provided on contact plugs C2 included in the first column and contact plugs C2 included in the second column. Contact layers L1 and L2 belong to a first-level interconnect layer. Contact plugs C3 are provided on the center portions of contact layers L2. Contact layers L4 are provided on contact plugs C3. Contact layers L3 and L4 and bit line BL3 belong to a second-level interconnect layer. FIG. 32 is a layout diagram illustrating a part from contact plugs C1 and C2 to the second-level interconnect layer, which is extracted from FIG. 28.

Contact plugs C4 are provide on contact layers L3. Contact layers L5 are provided on contact plugs C4.

Figure 33:
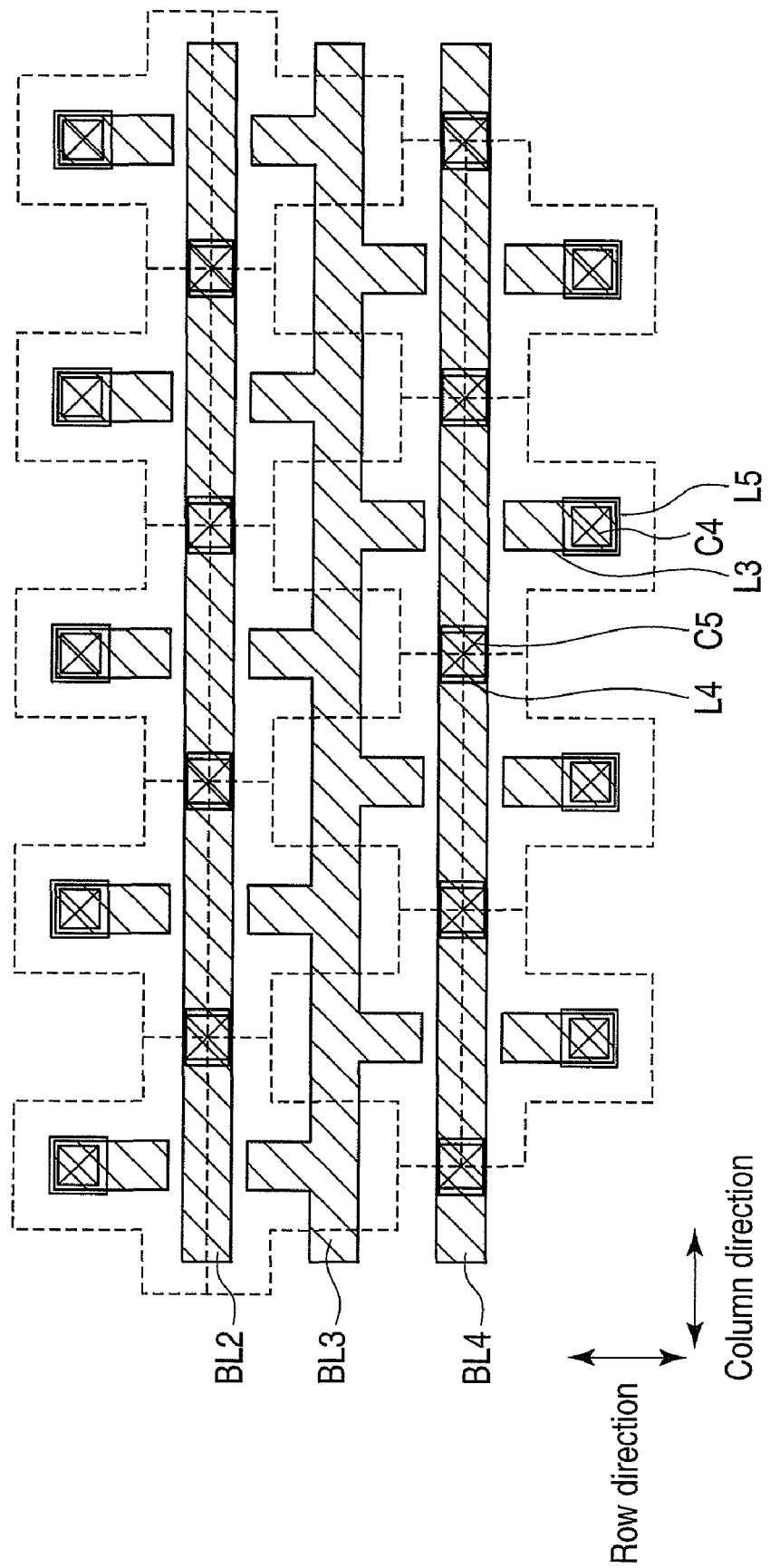
FIG. 33 is a layout diagram of layers being a part of the structure of FIG. 28 and extracted from FIG. 28.

Contact plugs C5 are provided on contact layers L4. Bit line BL2 extending in the column direction is provided on contact plugs C5. Bit line BL4 has the same structure as bit line BL2. Bit lines BL2 and BL4 and contact layers L5 belong to a third-level interconnect layer. FIG. 33 is a layout diagram illustrating a part from the second-level interconnect layer to the third-level interconnect layer, which is extracted from FIG. 28.

Contact plugs C6 are provided on contact layers L5. Bit line BL1 extending in the column direction is provided on contact plugs C6, to connect contact plugs C6. Specifically, bit line BL1 is formed of an extending portion extending in the column direction, and projecting portions which project in the row direction at positions of the respective contact plugs C6. In other words, the extending portion included in bit line BL1 is disposed close to the center of the column unit. Bit line BL5 has the same structure as bit line BL1. Bit lines BL1 and BL5 belong to a fourth-level interconnect layer. FIG. 34 is a layout diagram illustrating a part from the third-level interconnect layer to the fourth-level interconnect layer, which is extracted from FIG. 28.

As described above, one column unit formed of four columns and five bit lines BL1 to BL5 are formed. In addition, a memory cell array is formed by arranging a plurality of column units, one of which is illustrated in FIG. 28, in the row direction.

Figure 35:
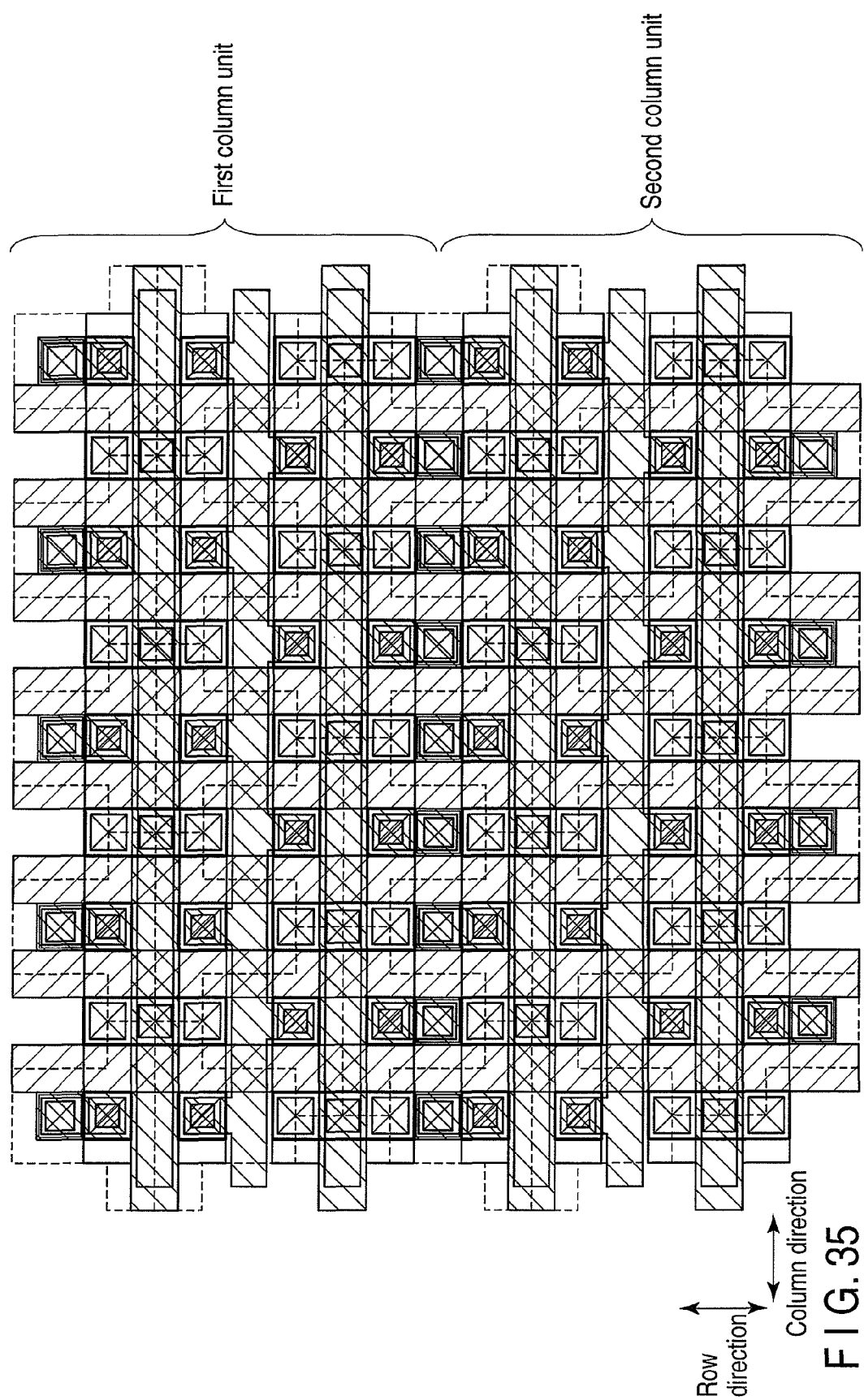
FIG. 35 is a layout diagram illustrating two column units arranged in a row direction.

FIG. 35 is a layout diagram illustrating two column units arranged in the row direction. A first column unit and a second column unit which are adjacent in the row direction are arranged such that projecting portions and recessed portions of broken lines indicating areas of the memory cells MC are engaged with one another. The first column unit and the second column unit are connected to the same word lines.

As detailed above, according to the fourth embodiment, four columns form one column unit, like the second embodiment. In addition, the active areas AA are formed in a stripe pattern. In addition, bit lines BL1 and BL5 located on the both sides of the column unit are formed by using the fourth-level interconnect layer, and arranged close to the center.

Therefore, according to the fourth embodiment, like the second embodiment, not only the layout area of a 2T1R memory cell MC can be reduced to $8F^2$, but also the active areas AA can be formed in a stripe pattern, that is, a rectangular periodical repetitive pattern. This structure enables reduction in the chip size, and it is possible to realize the semiconductor memory device of lower cost. In addition, it is possible to form the active areas AA with high accuracy.

(Fifth Embodiment)

A fifth embodiment is a modification of the second embodiment. In the fifth embodiment, the central bit line BL3 is formed by a double-layered interconnect layer. A circuit diagram of a resistance-change memory according to the fifth embodiment is the same as FIG. 12.

Figure 38:
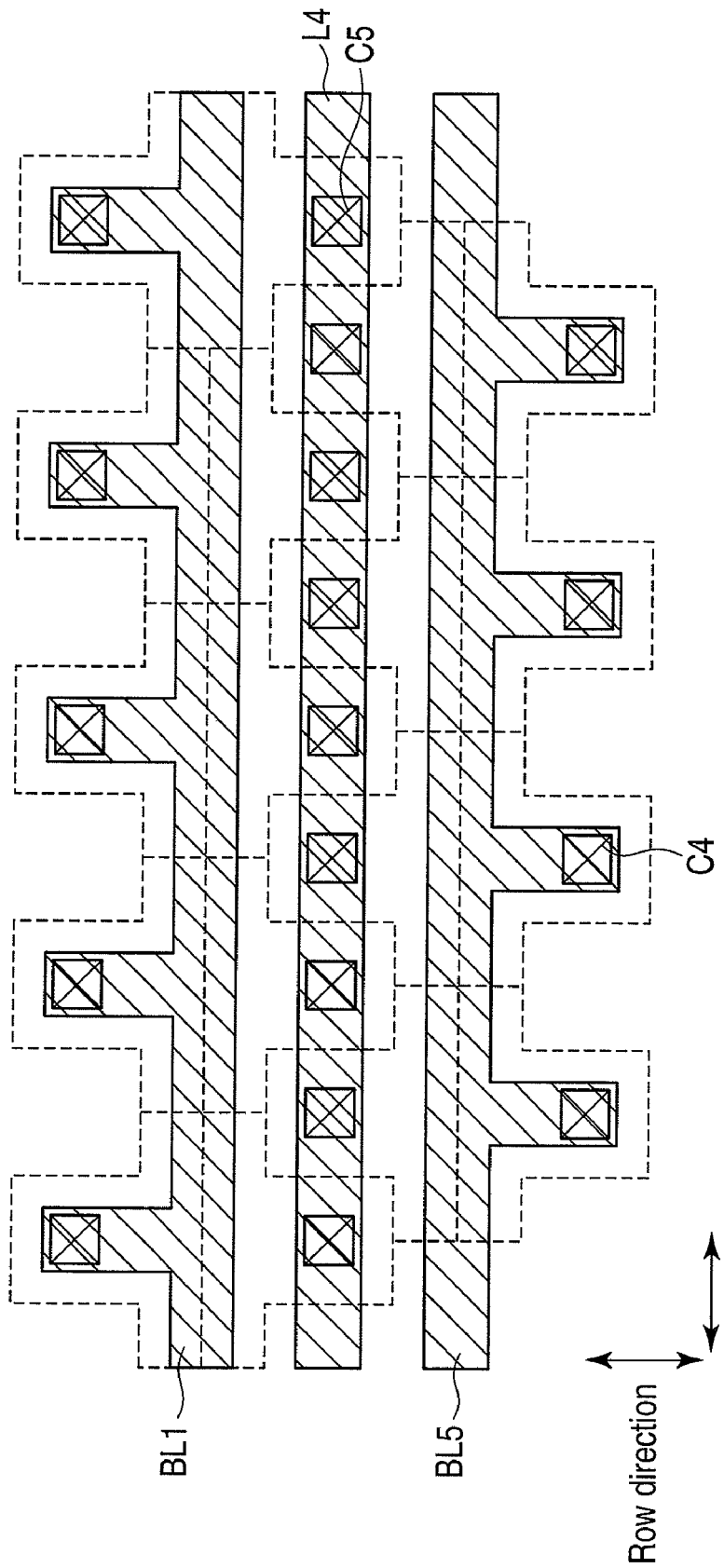
FIG. 38 is a layout diagram of layers being a part of the structure of FIG. 36 and extracted from FIG. 36.

FIG. 36 is a layout diagram illustrating the resistance-change memory according to the fifth. FIG. 37 is a layout diagram illustrating a part from a second-level interconnect layer to a third-level interconnect layer, which is extracted from FIG. 36. FIG. 38 is a layout diagram illustrating the third-level interconnect layer, which is extracted from FIG. 36. The structure from the active areas AA to the second-level interconnect layer is the same as that of the second embodiment.

A plurality of contact plugs C5 are provided on bit line BL3 formed by the second-level interconnect layer. A contact layer L4 extending in the column direction is provided on contact plugs C5, to connect contact plugs C5. Contact layer L4 is formed of the third-level interconnect layer to which bit lines BL1 and BL5 belong.

As described above, one column unit formed of four columns and five bit lines BL1 to BL5 are formed. In addition, a memory cell array is formed by arranging a plurality of column units, one of which is illustrated in FIG. 36, in the row direction. Layout illustrating two column units arranged in the row direction is the same as FIG. 19, except for the structure of bit line BL3 and contact plugs C5 arranged on the BL3.

As detailed above, according to the fifth embodiment, the layout area of a 2T1R memory cell MC can be reduced to $8F^2$, like the second embodiment. In addition, since bit line BL3 is formed by a double-layered interconnect layer, the resistance of bit line BL3 can be reduced. In addition, since bit lines BL1 and BL5 and contact layer L4 which belong to the third-level interconnect layer are arranged at equal intervals, processing by lithography can be performed with high accuracy. This reduces variations in shape of the third-level interconnect layer. In addition, since contact plugs C4 and C5 are arranged at equal intervals in comparison with the second embodiment, it is also possible to perform processing thereof by lithography with high accuracy.

(Sixth Embodiment)

A sixth embodiment is a modification of the second embodiment. In the sixth embodiment, the central bit line BL3 is formed by a third-level interconnect layer. A circuit diagram of a resistance-change memory according to the sixth embodiment is the same as FIG. 12.

Figure 41:
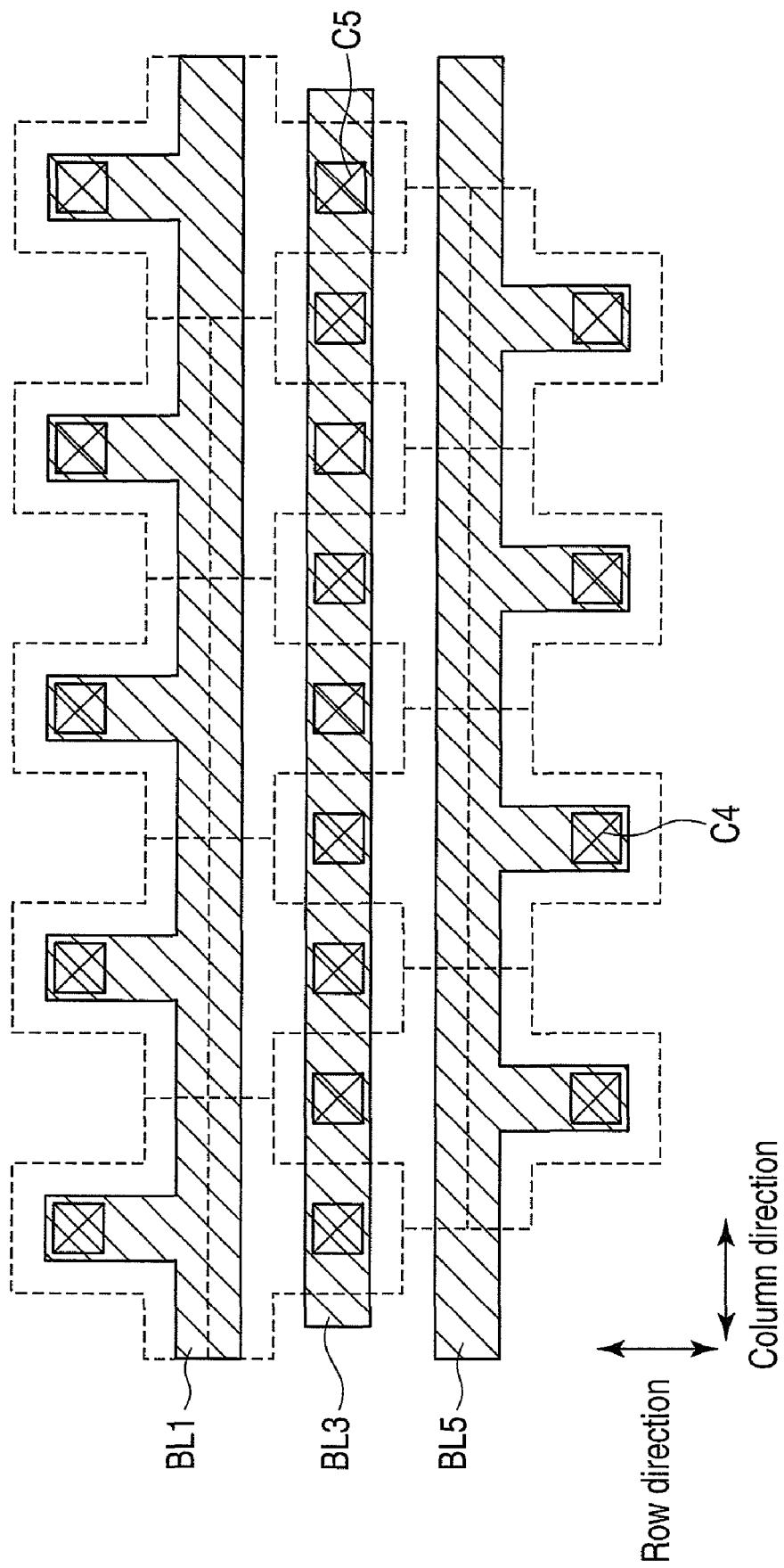
FIG. 41 is a layout diagram of layers being a part of the structure of FIG. 39 and extracted from FIG. 39.

FIG. 39 is a layout diagram illustrating the resistance-change memory according to the sixth. FIG. 40 is a layout diagram illustrating a part from a second-level interconnect layer to a third-level interconnect layer, which is extracted from FIG. 39. FIG. 41 is a layout diagram illustrating the third-level interconnect layer, which is extracted from FIG. 39. The structure from the active areas AA to the second-level interconnect layer is the same as that of the second embodiment.

In the sixth embodiment, bit line BL3 in FIG. 18 of the second embodiment is divided into a plurality of parts for the respective MTJ elements 10, and serves as a plurality of contact layers L4 in FIG. 40. A plurality of contact plugs C5 are provided on the respective contact layers L4. Bit line BL3 extending in the column direction is provided on contact plugs C5, to connect contact plugs C5. Contact layers L4 are formed of the second-level interconnect layer to which bit lines BL2 and BL4 belong. Bit lines BL1, BL3 and BL5 are formed of the third-level interconnect layer.

As described above, one column unit formed of four columns and five bit lines BL1 to BL5 are formed. In addition, a memory cell array is formed by arranging a plurality of column units, one of which is illustrated in FIG. 39, in the row direction. Layout illustrating two column units arranged in the row direction is the same as FIG. 19, except for the above changed part relating to the structure of bit line BL3.

As detailed above, according to the sixth embodiment, the layout area of a 2T1R memory cell MC can be reduced to $8F^2$, like the second embodiment. In addition, since bit lines BL1, BL3 and BL5 which belong to the third-level interconnect layer are arranged at equal intervals, processing by lithography can be performed with high accuracy. This reduces variations in shape of the third-level interconnect layer. In addition, since contact plugs C4 and C5 are arranged at equal intervals in comparison with the second embodiment, it is also possible to perform processing thereof by lithography with high accuracy. In addition, bit lines BL2 and BL4 to which select transistors T1 and T2 of memory cells are connected are formed only of the second-level interconnect layer, and bit lines BL1, BL3 and BL5 to which the resistive memory elements 10 are connected are formed only of the third-level interconnect layer. In other words, the interconnect layers of the bit lines can be unified according to the type of devices to be connected, and thus it is possible to suppress the influence of interconnect resistance of the bit lines on the read margin to minimum, and improve the operation yield of the chip.

Although the above embodiments are explained with an example of using common planar MOSFETs as transistors forming memory cells, it is possible to use transistors such as fin-FET, double fin-FET (for example, see Technical Digest of VLSI Symposium on Technology 2008, pp. 12-13), gate-all-around (GAA) transistors (for example, see 2008 IEDM Technical Digest, pp. 757-760 and pp. 769-772), and Si nanowire transistors (for example, see 2008 IEDM Technical Digest, pp. 745-748 and pp. 749-752).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   bit line pairs extending in a column direction, each of the bit line pairs comprising a first bit line and a second bit line; and
   memory cell groups connected to the bit line pairs, respectively, and each comprising memory cells,
   wherein each of the memory cells comprises a first transistor, a second transistor and a resistive memory element,
   a gate electrode of the first transistor is connected to a first word line extending in a row direction,
   a gate electrode of the second transistor is connected to a second word line extending in the row direction,
   one end of the resistive memory element is connected to the first bit line,
   a drain region of the first transistor and a drain region of the second transistor are connected to each other and connected to the other end of the resistive memory element,
   a source region of the first transistor and a source region of the second transistor are connected to the second bit line,
   a second transistor of a first memory cell shares a source region with a first transistor of a second memory cell which is adjacent to the first memory cell in the column direction,
   two bit line pairs which are adjacent in the row direction comprise a first column unit by connecting first bit lines thereof to each other, or connecting second bit lines thereof to each other,
   a second bit line or a first bit line located at a center of the first column unit is formed of a first interconnect layer,
   a first bit line or a second bit line located at least one end portion of the first column unit is formed of a second interconnect layer located above the first interconnect layer,
   the second interconnect layer is connected to a diffusion region of the first transistor or a diffusion region of the second transistor through a first contact or the resistive memory element, and
   a first bit line or a second bit line located at least one end portion is located closer to a center of the first column unit than a connecting part between the bit line and a lower layer.

2. The device of claim 1, wherein first bit lines or second bit lines disposed at both end portions of the first column unit are formed of the second interconnect layer.

3. The device of claim 1, wherein
   two first column units adjacent in the row direction comprise a second column unit such that first bit lines or second bit lines formed of the first interconnect layer and located at end portions of the two first column units are connected to each other, and
   the first bit lines or the second bit lines located at both end portions of the second column unit are formed of the second interconnect layer.

4. The device of claim 1, further comprising the first column units arranged in the row direction,
   wherein a first word line of a first column unit of an odd number is connected to a second word line of a first column unit of an even number.

5. The device of claim 3, further comprising the second column units arranged in the row direction,
   wherein a first word line of a second column unit of an odd number is connected to a second word line of a second column unit of an even number.

6. The device of claim 3, wherein the first bit lines or the second bit lines located at both end portions of the second column unit are located above first bit lines or second bit lines, which are adjacent to the bit lines located at both end portions and formed of the first interconnect layer.

7. The device of claim 3, wherein
   the first bit lines or the second bit lines connected to each other are formed of a third interconnect layer, and
   the third interconnect layer is located below the first interconnect layer.

8. The device of claim 3, wherein the first bit lines or the second bit lines connected to each other are formed of two layers of the first interconnect layer and the second interconnect layer.

9. The device of claim 3, wherein the first bit lines or the second bit lines connected to each other are formed of the second interconnect layer.

10. The device of claim 1, wherein the resistive memory element is a magnetoresistive element.

* * * * *